United States Patent
Shchukin et al.

(10) Patent No.: US 10,777,969 B1
(45) Date of Patent: Sep. 15, 2020

(54) WAVELENGTH-STABILIZED NEAR-FIELD OPTOELECTRONIC DEVICE

(71) Applicant: VI Systems GmbH, Berlin (DE)

(72) Inventors: Vitaly Shchukin, Berlin (DE); Nikolay Ledentsov, Berlin (DE)

(73) Assignee: VI SYSTEMS GmbH, Berlin (DE)

( * ) Notice: Subject to any disclaimer, the term of this patent is extended or adjusted under 35 U.S.C. 154(b) by 0 days.

(21) Appl. No.: 16/656,323

(22) Filed: Oct. 17, 2019

Related U.S. Application Data

(63) Continuation of application No. 16/364,180, filed on Mar. 26, 2019, now Pat. No. 10,666,017.

(51) Int. Cl.
*H01S 5/183* (2006.01)
*H01S 5/22* (2006.01)
(Continued)

(52) U.S. Cl.
CPC ........ *H01S 5/18302* (2013.01); *H01S 5/0215* (2013.01); *H01S 5/1021* (2013.01);
(Continued)

(58) Field of Classification Search
CPC .. H01S 5/068; H01S 5/06821; H01S 5/18302; H01S 5/18311; H01S 5/18313;
(Continued)

(56) References Cited

U.S. PATENT DOCUMENTS

2010/0038669 A1* 2/2010 McKenzie .............. H01L 33/42
257/98

* cited by examiner

*Primary Examiner* — Armando Rodriguez

(74) *Attorney, Agent, or Firm* — Gordon Rees Scully Mansukkani, LLP

(57) ABSTRACT

An in-plane-emitting semiconductor diode laser employs a surface-trapped optical mode existing at a boundary between a distributed Bragg reflector and a homogeneous medium, dielectric or air. The device can operate in both TM-polarized and TE-polarized modes. The mode exhibits an oscillatory decay in the DBR away from the surface and an evanescent decay in the dielectric or in the air. The active region is preferably placed in the top part of the DBR close to the surface. The mode behavior strongly depends on the wavelength of light, upon increase of the wavelength the mode becomes more and more extended into the homogeneous medium, the optical confinement factor of the mode in the active region drops until the surface-trapped mode vanishes. Upon a decrease of the wavelength, the leakage loss of the mode into the substrate increases. Thus, there is an optimum wavelength, at which the laser threshold current density is minimum, and at which the lasing starts. This optimum wavelength is temperature-stabilized, and shifts upon temperature increase at a low rate less than 0.1 nm/K, indicating wavelength-stabilized operation of the device. The approach applies also to semiconductor optical amplifiers or semiconductor gain chips which are also wavelength-stabilized. Reflectivity of the surface-trapped mode from an uncoated facet of the device can be extremely low, also <1E−4 or even <1E−5 which is particularly advantageous for amplifiers or gain chips. For diode lasers, a specific intermediate reflective coating can be deposited on the facet to put its reflectivity into a range from 0.5% to 3%, which lies within targeted values for lasers. An optical integrated circuit can employ wavelength-stabilized amplifiers operating in a surface-trapped mode, wherein such devices amplify light propagating along a dielectric waveguide.

24 Claims, 24 Drawing Sheets

(51) Int. Cl.
  *H01S 5/20* (2006.01)
  *H01S 5/02* (2006.01)
  *H01S 5/10* (2006.01)
  *H01S 5/42* (2006.01)
  *H01S 5/026* (2006.01)

(52) U.S. Cl.
  CPC .......... *H01S 5/1035* (2013.01); *H01S 5/1833* (2013.01); *H01S 5/18311* (2013.01); *H01S 5/18313* (2013.01); *H01S 5/18333* (2013.01); *H01S 5/18352* (2013.01); *H01S 5/18361* (2013.01); *H01S 5/18377* (2013.01); *H01S 5/205* (2013.01); *H01S 5/222* (2013.01); *H01S 5/026* (2013.01); *H01S 5/18369* (2013.01); *H01S 5/423* (2013.01); *H01S 2301/166* (2013.01); *H01S 2301/176* (2013.01)

(58) Field of Classification Search
  CPC ............... H01S 5/1833; H01S 5/18333; H01S 5/18352; H01S 5/18361; H01S 5/18377; H01S 5/0215; H01S 5/1021; H01S 5/1035; H01S 5/026; H01S 5/18369; H01S 5/423; H01S 2301/166; H01S 2301/176
  See application file for complete search history.

Inside: Outside:

TM:

TE:

WAVELENGTH-STABILIZED NEAR-FIELD OPTOELECTRONIC DEVICE

REFERENCE TO RELATED APPLICATIONS

This is a continuation-in-part of U.S. patent application Ser. No. 16/364,180, filed Mar. 26, 2019, entitled: "Optoelectronic Device Based on a Surface-Trapped Optical Mode". The aforementioned application is hereby incorporated herein by reference.

BACKGROUND OF THE INVENTION

Field of the Invention

The invention pertains to the field of optoelectronic devices. More particularly, the invention pertains to light emitting devices.

Description of Related Art

There is a need in wavelength-stabilized semiconductor diode lasers for a wide range of applications, such as pumping of erbium- and ytterbium-doped fibers at about 975 nm, solid state laser pumping at 808 nm, frequency conversion at 1060 and 920 nm, and in telecommunications for wavelength division long haul transmission in multiplexing. In conventional edge-emitting lasers, the emission spectrum is broad and the wavelength shift of the lasing wavelength with temperature is governed by the thermal shift of the semiconductor energy band gap. For ~1 µm range GaInAs/GaAs quantum well laser, the shift is about 0.4 nm/K. This makes their applications in telecommunication and longer reach datacommunication applications at high frequency impossible.

Conventional approaches to achieve wavelength-stabilized operation include rather expensive external cavity optical disk lasers or relatively low power single mode distributed feedback (DFB) lasers or volume fiber grating-coupled lasers.

Recently, all-epitaxial approaches to wavelength-stabilized semiconductor diode lasers have been developed. Tilted cavity laser (TCL) was disclosed in the U.S. Pat. No. 7,031,360, entitled "TILTED CAVITY SEMICONDUCTOR LASER (TCSL) AND METHOD OF MAKING SAME", filed Feb. 12, 2002, issued Apr. 18, 2006, and in the U.S. patent application Ser. No. 11/194,181, entitled "TILTED CAVITY SEMICONDUCTOR DEVICE AND METHOD OF MAKING SAME", filed Aug. 1, 2005, published online Dec. 15, 2005, publication US2005/0276296, both invented by the inventors of the present invention, whereas both are hereby incorporated herein in their entirety by reference. Tilted cavity laser is based on the resonant interaction between an antiwaveguiding cavity for the optical mode and a narrow-stopband multilayer interference reflector (MIR) supporting the wavelength-stabilized lasing at a certain tilt angle of the light in the MIR, and thus, at a certain wavelength of the cavity mode. The thermal shift of the wavelength can be controlled and completely temperature-insensitive lasing wavelength can be achieved. Implementation of the TCL concept is still challenging as it includes a need to grow epitaxially a complex, thick and difficult-to-calibrate MIR-structure to enable a narrow reflectivity peak of the MIR stopband required to provide a low leakage loss cavity mode only at a certain wavelength.

Tilted wave laser (TWL) was disclosed in the U.S. Pat. No. 7,421,001 entitled "EXTERNAL CAVITY OPTOELECTRONIC DEVICE", filed Jun. 16, 2006, issued Sep. 2, 2008, and in the U.S. Pat. No. 7,583,712 entitled "OPTOELECTRONIC DEVICE AND METHOD OF MAKING SAME", filed Jan. 3, 2007, issued Sep. 1, 2009, both invented by the inventors of the present invention, whereas both are hereby incorporated herein in their entirety by reference. TWL is based on the phase matching between the optical wave leaking from a thin active waveguide to a thick passive waveguide and returning back and the wave propagating along the active waveguide and thus provides wavelength-stabilized lasing. TWL emits laser light in two coherent vertical lobes allowing a quasi-Bessel-like self-healing beam. However, opposite to the TCL concept, the wavelength stabilization requires a weak coupling between the elements and the beam profile may become complex in case of wavelength-stabilized operation.

Recently, in the parent patent application U.S. Ser. No. 16/364,180, an optoelectronic semiconductor device was proposed based on a coupling between a resonant cavity mode of a vertical cavity surface-emitting laser (VCSEL) and a surface-trapped mode enabling in-plane-emitting semiconductor laser or semiconductor optical amplifier.

FIG. 1 shows schematically a cross-section of a VCSEL (1100) reproducing FIG. 13 of U.S. Ser. No. 16/364,180. The VCSEL is grown on a substrate (101) and contains a resonant cavity (103) sandwiched between a bottom, typically n-doped distributed Bragg reflector (DBR) (102) and a top, typically p-doped DBR (1106). The active medium (105) is placed in the resonant cavity (103). Once a forward bias (113) is applied to the active medium (105) via the bottom contact (111) and the top contact (112), the active medium generates optical gain resulting in emitting of the laser light (1135). The selective oxidation of one or several Ga(1-x)Al(x)As layers with a high Al content results in the formation of one or several apertures confined by the layers of an oxide (145). The oxide-confined aperture serves to determine the current path through the active medium in such a way that no current flows and no light is generated beneath the top contact, which would otherwise lead to excessive absorption of light. The parent application U.S. Ser. No. 16/364,180 focuses on another feature of the oxide confined apertures, which defines the non-oxidized core (150) and the oxidized periphery (160). The vertically-emitting laser light (1135) comes out from the non-oxidized core. It was demonstrated in U.S. Ser. No. 16/364,180 that the vertical mode of the core part (150) of the VCSEL (1100) can be coupled to certain optical modes in the periphery (160). One of these modes is a surface-trapped TM-polarized depicted in FIG. 2, which reproduces FIG. 2 of U.S. Ser. No. 16/364,180.

Since the resonant cavity mode of a VCSEL is wavelength-stabilized, modes coupled to it are also wavelength-stabilized. Therefore related in-plane-emitting devices will operate in a wavelength-stabilized mode. However, the structure is then excessively complex and can emit additional optical modes, unneeded for in-plane operation, such as the vertical cavity mode. To make the device emitting in an in-plane mode only is a challenging task.

Thus, there is a need in the art to employ a surface-trapped optical mode and to construct a significantly less complex wavelength-stabilized optoelectronic device.

SUMMARY OF THE INVENTION

An in-plane-emitting semiconductor diode laser employs a surface-trapped optical mode existing at a boundary between a distributed Bragg reflector and a homogeneous medium, dielectric or air. The device can operate in both TM-polarized and TE-polarized modes. The mode exhibits an oscillatory decay in the DBR away from the surface and an evanescent decay in the dielectric or in the air. The active medium is preferably placed in the top part of the DBR close to the surface. The mode behavior strongly depends on the wavelength of light, upon increase of the wavelength the mode becomes more and more extended into the homogeneous medium, the optical confinement factor of the mode in the active medium drops until the surface-trapped mode vanishes. Upon a decrease of the wavelength, the leakage loss of the mode into the substrate increases. Thus, there is an optimum wavelength, at which the laser threshold current density is minimum, and at which the lasing starts. This optimum wavelength is temperature-stabilized, and shifts upon temperature increase at a low rate less than 0.1 nm/K, indicating wavelength-stabilized operation of the device. The approach applies also to semiconductor optical amplifiers or semiconductor gain chips which are also wavelength-stabilized. Reflectivity of the surface-trapped mode from an uncoated facet of the device can be extremely low, also <1E−4 or even <1E−5 which is particularly advantageous for amplifiers or gain chips. For diode lasers, a specific intermediate reflective coating can be deposited on the facet to put its reflectivity into a range from 0.5% to 3%, which lies within targeted values for lasers. An optical integrated circuit can employ wavelength-stabilized amplifiers operating in a surface-trapped mode, wherein such devices amplify light propagating along a dielectric waveguide.

BRIEF DESCRIPTION OF THE DRAWINGS

FIG. 12A displays the optical confinement factor versus wavelength.

FIG. 12B depicts the leakage loss versus wavelength.

FIG. 12C shows the threshold material gain in the quantum wells versus wavelength.

FIG. 12D represents the threshold current density versus wavelength.

FIG. 13A displays the threshold current density.

FIG. 13B shows the fraction of the optical power accumulated in the air, outside the laser chip.

FIG. 13C displays the spectral width, within which the threshold current density exceeds the minimum value no more than twice.

FIG. 13D shows the spectral width of the threshold material gain in the quantum wells, defined in a similar way as in FIG. 13C.

FIG. 19A displays the optical confinement factor versus wavelength.

FIG. 19B depicts the leakage loss versus wavelength.

FIG. 19C shows the threshold material gain in the quantum wells versus wavelength.

FIG. 19D represents the threshold current density versus wavelength.

FIG. 20A displays the threshold current density.

FIG. 20B shows the fraction of the optical power accumulated in the air, outside the laser chip.

FIG. 20C displays the spectral width, within which the threshold current density exceeds the minimum value no more than twice.

FIG. 20D shows the spectral width of the threshold material gain in the quantum wells, defined in a similar way as in FIG. 19C.

DETAILED DESCRIPTION OF THE INVENTION

Figure 1:
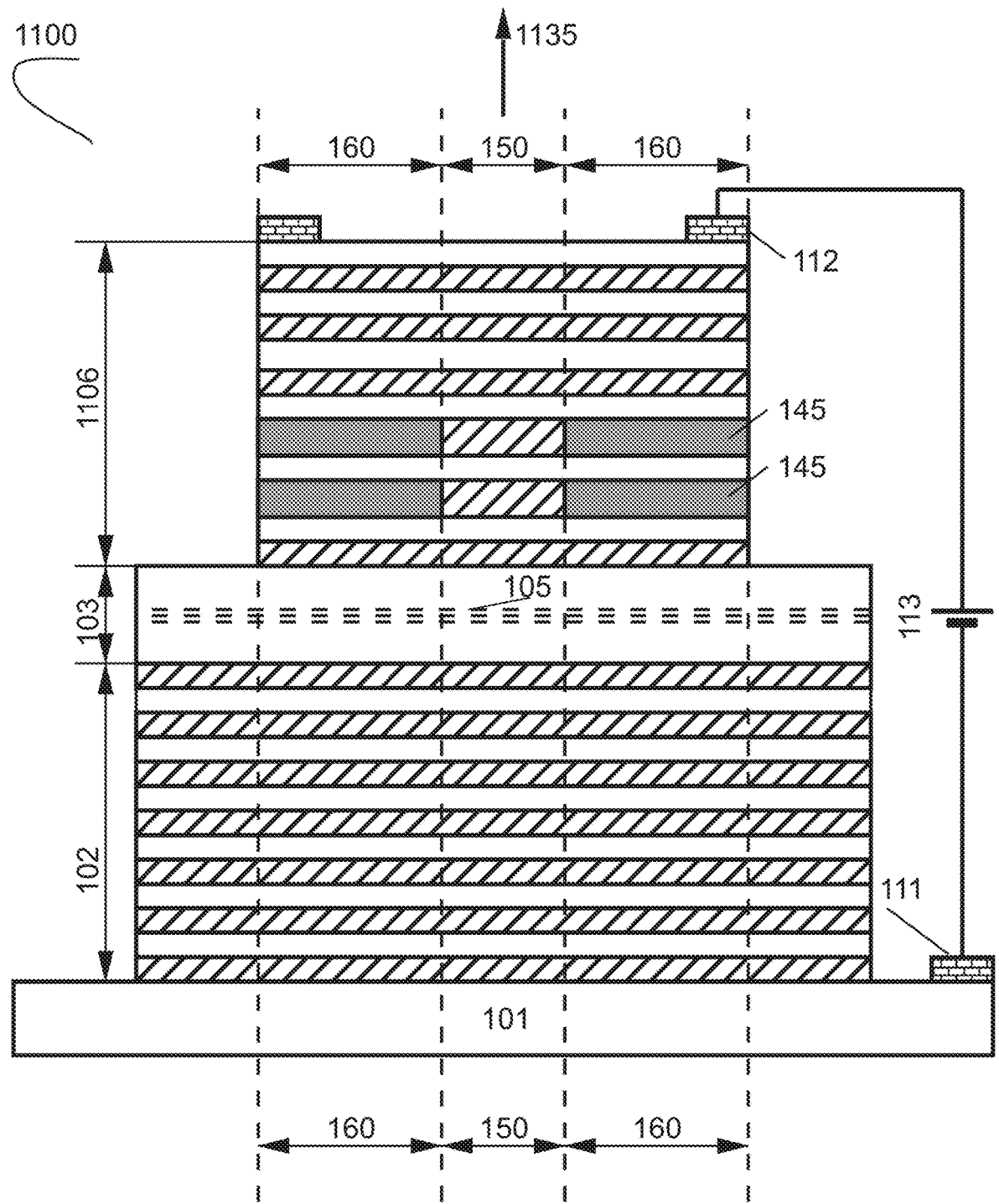
FIG. 1. Schematic cross-section of a vertical cavity surface-emitting laser (VCSEL) with oxide-confined apertures.
Figure 2:
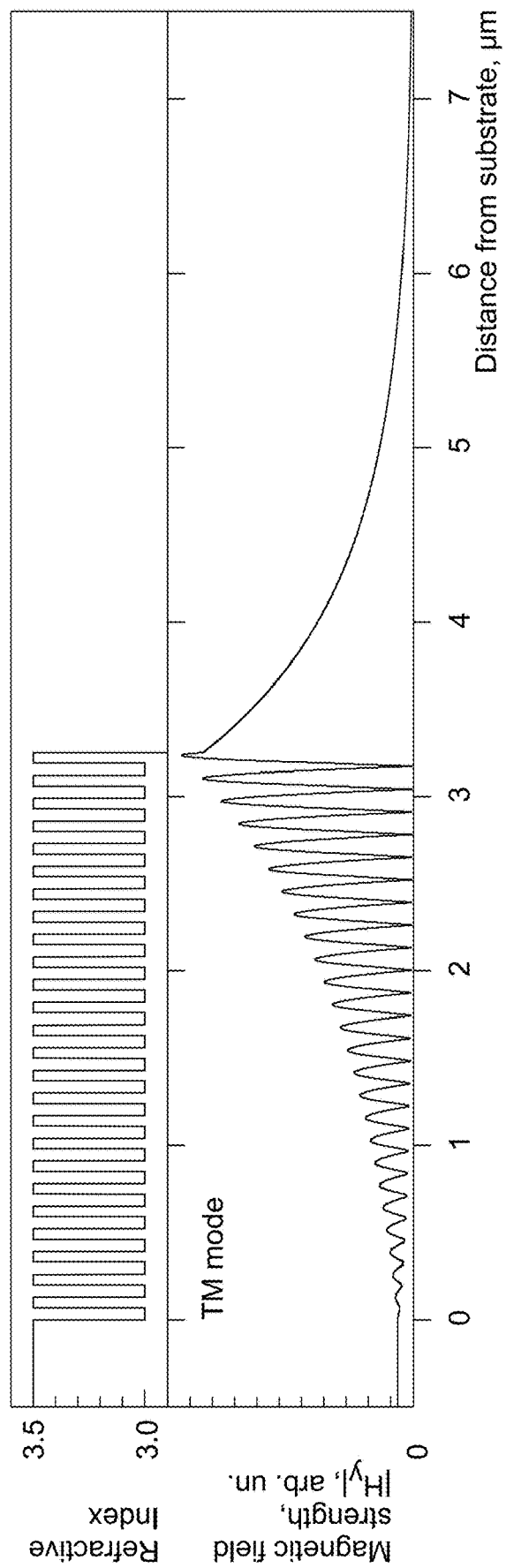
FIG. 2. Refractive index profile of a semiconductor distributed Bragg reflector (DBR) and the magnetic field strength profile of a TM optical mode, localized on the surface of the DBR.
Figure 3:
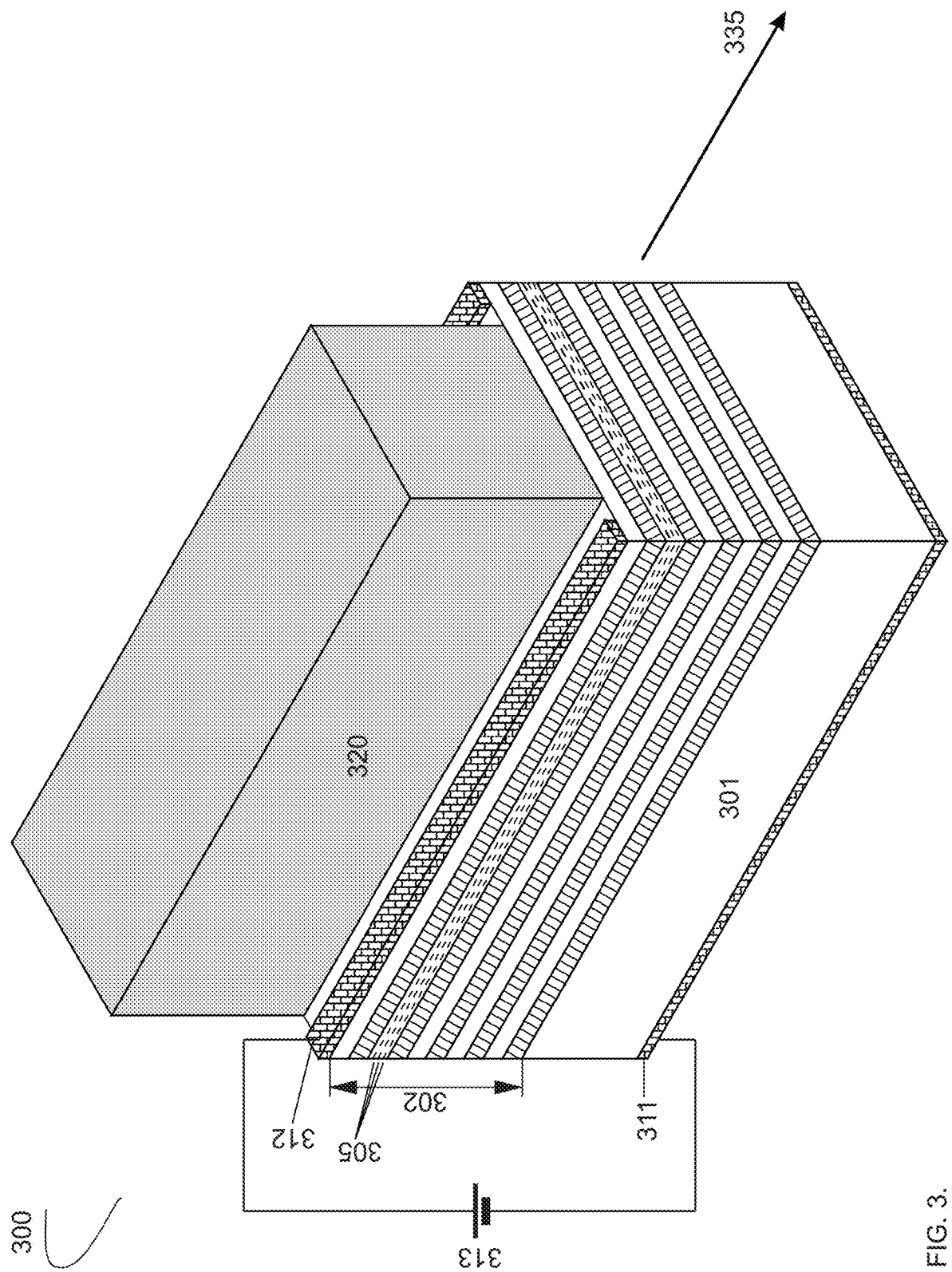
FIG. 3. Perspective view of an edge-emitting laser according to an embodiment of the present invention.

FIG. 3 shows an edge-emitting laser (300) according to an embodiment of the present invention. A distributed Bragg reflector (302) is grown epitaxially on a substrate (301). The active medium (305) is introduced into the distributed Bragg reflector (302). A homogeneous dielectric medium (320) is attached to the top surface of the distributed Bragg reflector (302). The forward bias (313) is applied to the active medium (305) via the bottom contact (311) and the top contact (312). Thus the optical gain is generated in the active medium, and the device emits in-plane laser light (335).

In another embodiment of the present invention no dielectric is attached to the top DBR layer, and the DBR is bounded from the top by air.

In yet another embodiment of the present invention the optical gain is generated in the active medium due to photoexcitation.

In a further embodiment of the present invention the optical gain is generated in the active medium due to electron beam excitation.

Figure 4:
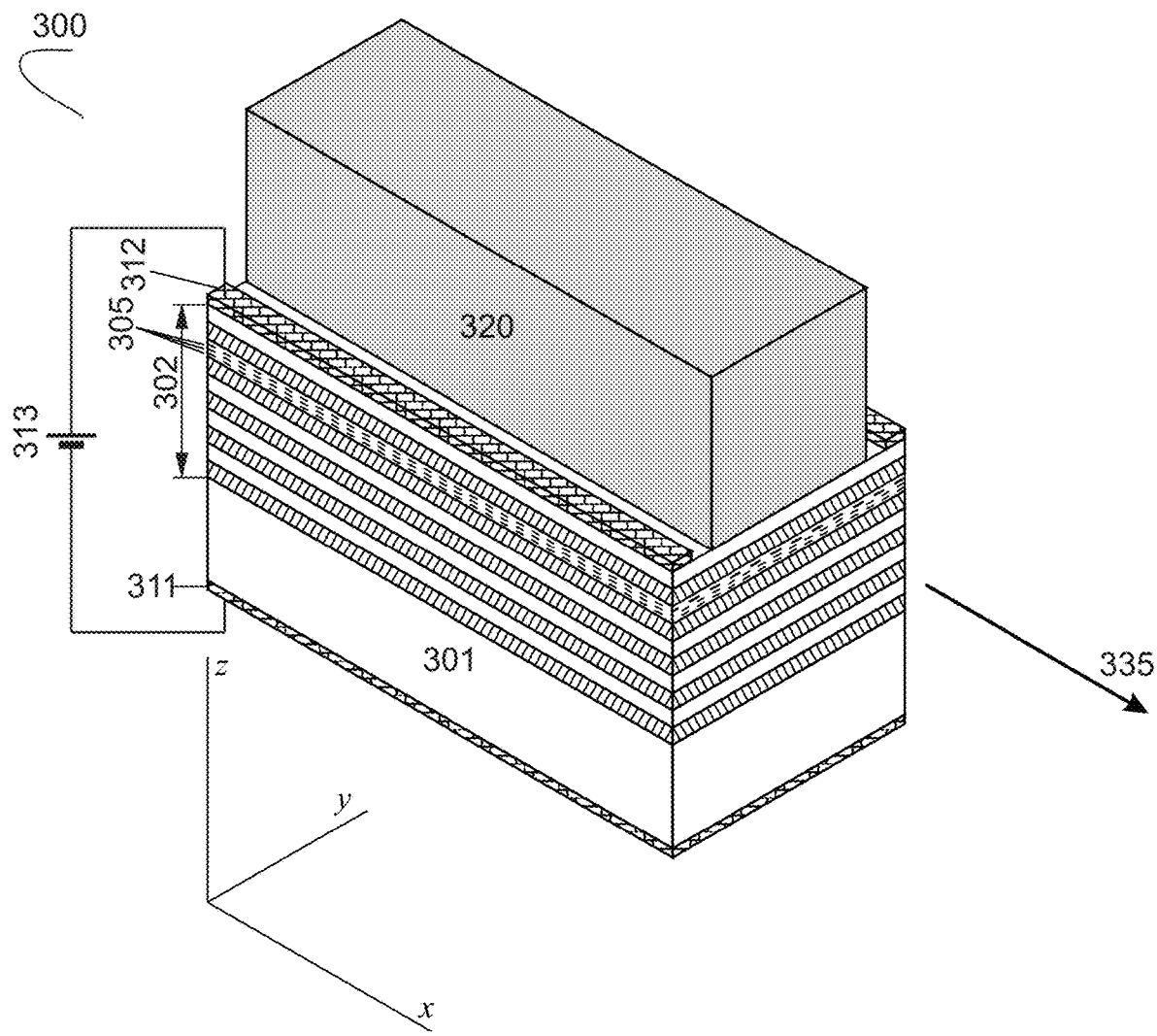
FIG. 4. Perspective view of an edge-emitting laser of the embodiment of FIG. 3 and illustration of the non-zero components of the electric and magnetic fields in the TM-polarized and TE-polarized optical modes.
Figure 4:
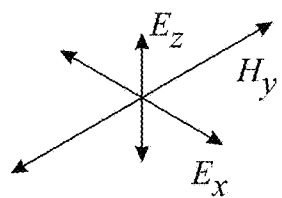
Figure 4:
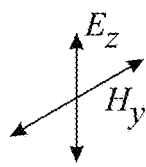
Figure 4:
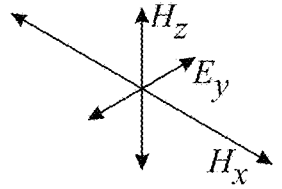
Figure 4:
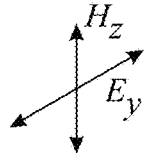

To analyze optical modes in the laser structure (300) it is useful to specify the reference frame and the polarization of the optical mode. FIG. 4 shows the definition of the three axes, whereas the z axes is directed vertically, the x axis is directed parallel to the propagation of the light in the laser structure. The optical wave of the TM polarization has, inside the semiconductor structure non-vanishing components $H_y$, $E_x$, and $E_z$, and outside the structure in the emitted laser beam only $H_y$ and $E_z$. The optical wave of the TE polarization has, inside the semiconductor structure non-vanishing components $E_y$, $H_x$, and $H_z$, and outside the structure in the emitted laser beam only $E_y$ and $H_z$.

Figure 5:
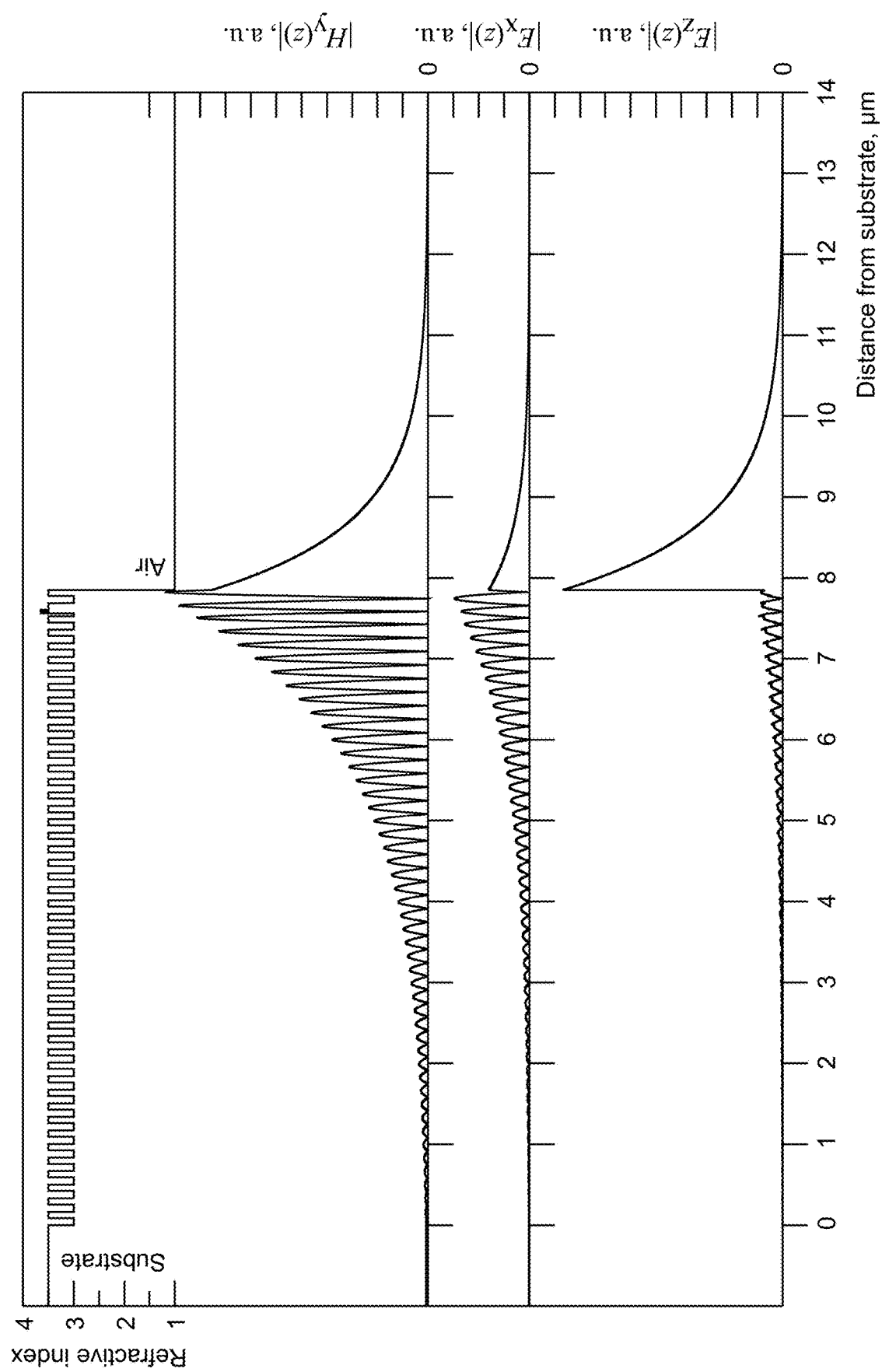
FIG. 5. Refractive index and optical field profiles of a TM-polarized surface-trapped mode in a laser structure of FIG. 3.

FIG. 5 illustrates the refractive index and optical field profiles in a model structure of a laser. The structure contains a DBR consisting of 45 periods of layers with alternating refractive indices $n_1=3.5$ and $n_2=3.0$, which are typical for Ga(1-x)Al(x)As alloy with a low and a high Al composition, respectively. The thicknesses of the layers equal $d_1=\lambda_0/(4n_1)$ and $d_2=\lambda_0/(4n_2)$, respectively. The wavelength $\lambda_0$ corresponding to the maximum reflectivity of the DBR at normal incidence is taken 1080 nm. Correspondingly, the individual layer thicknesses are $d_1$=77.2 nm and $d_2$=90 nm. The DBR is bounded from the top by air.

The active region contains three quantum wells, each having a thickness of 8 nm, with 9 nm-thick spacer. The boundary between two layers is shifted with respect to the ideally periodic structure in order to place the quantum wells into a local maximum of the in-plane component of the electric field. The refractive indices of the quantum wells are taken 3.65 which refers to compressively strained Ga(1-x)In(x)As quantum wells having a refractive index higher than that of GaAs.

Magnetic field profile in the TM-polarized optical mode is found from the wave equation $$-\frac{d}{dz}\left[\frac{1}{n^2(z)}\frac{d}{dz}H_y(z)\right] - \left(\frac{2\pi}{\lambda}\right)^2 H_y(z) = -\left(\frac{2\pi}{\lambda}\right)^2 \frac{1}{n^2(z)} n_{eff}^2 H_y(z). \quad (1)$$

Once magnetic field is found, the non-vanishing components of the electric field are found from the Maxwell's equations $E_x(z)=-ik_0^{-1}\varepsilon^{-1}(z)[dH_y(z)/dz]$ and $E_z(z)=-n_{eff}\varepsilon^{-1}(z)H_y(z)$, where $k_0=2\pi/\lambda$. We note that $|E_x(z)|$ has local maxima where $H_y(z)$ and $E_z(z)$ have nodes. The active region is placed at a local maximum of $|E_x(z)|$. We note that, according to Maxwell's equations, the z-component of the electric displacement field $D_z(z)=\varepsilon(z)E_z(z)$ is continuous at the interfaces, and the electric field component $E_z(z)$ exhibits discontinuities. In particular, $|E_z(z)|$ in the air close to the surface increases versus its value in the DBR by a factor of $\varepsilon_1=n_1^2=12.25$.

Figure 6:
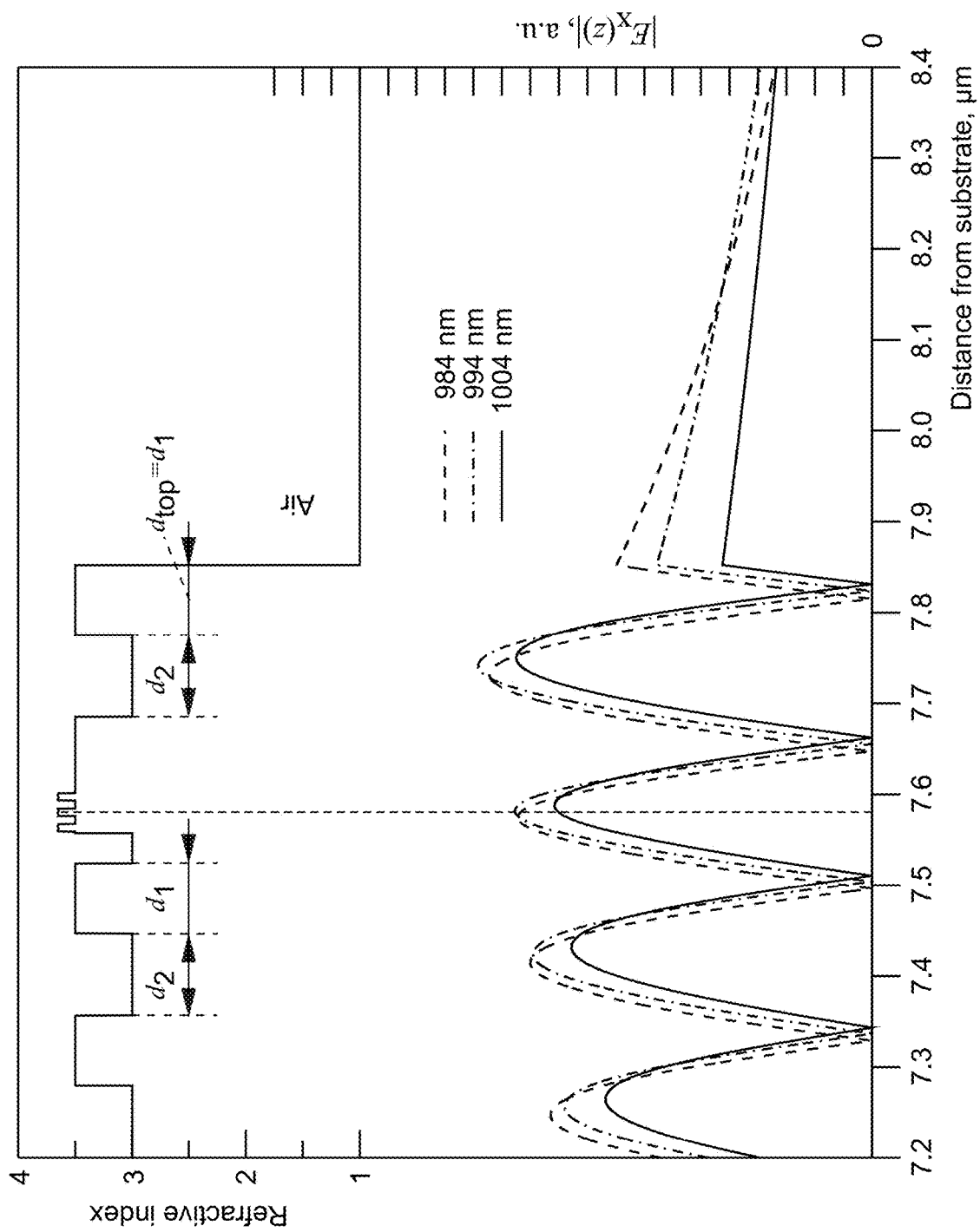
FIG. 6. Spatial profile of the in-plane component of the electric filed of the TM-polarized surface-trapped mode in the laser structure of FIG. 3 in the vicinity of the active medium at three wavelengths of light.

FIG. 6 illustrates the profiles $|E_x(z)|$ at three different wavelengths of light. Once the wavelength increases from 994 nm to 1004 nm, the absolute value of $|E_x(z)|$ in the active region drops as the field becomes more extended to the air. Once the wavelength decreases from 994 nm to 984 nm, the absolute value $|E_x(z)|$ in the local maximum remains nearly unchanged, but the maximum shifts away from the active region, thus its value in the active region also decreases.

Figure 7:
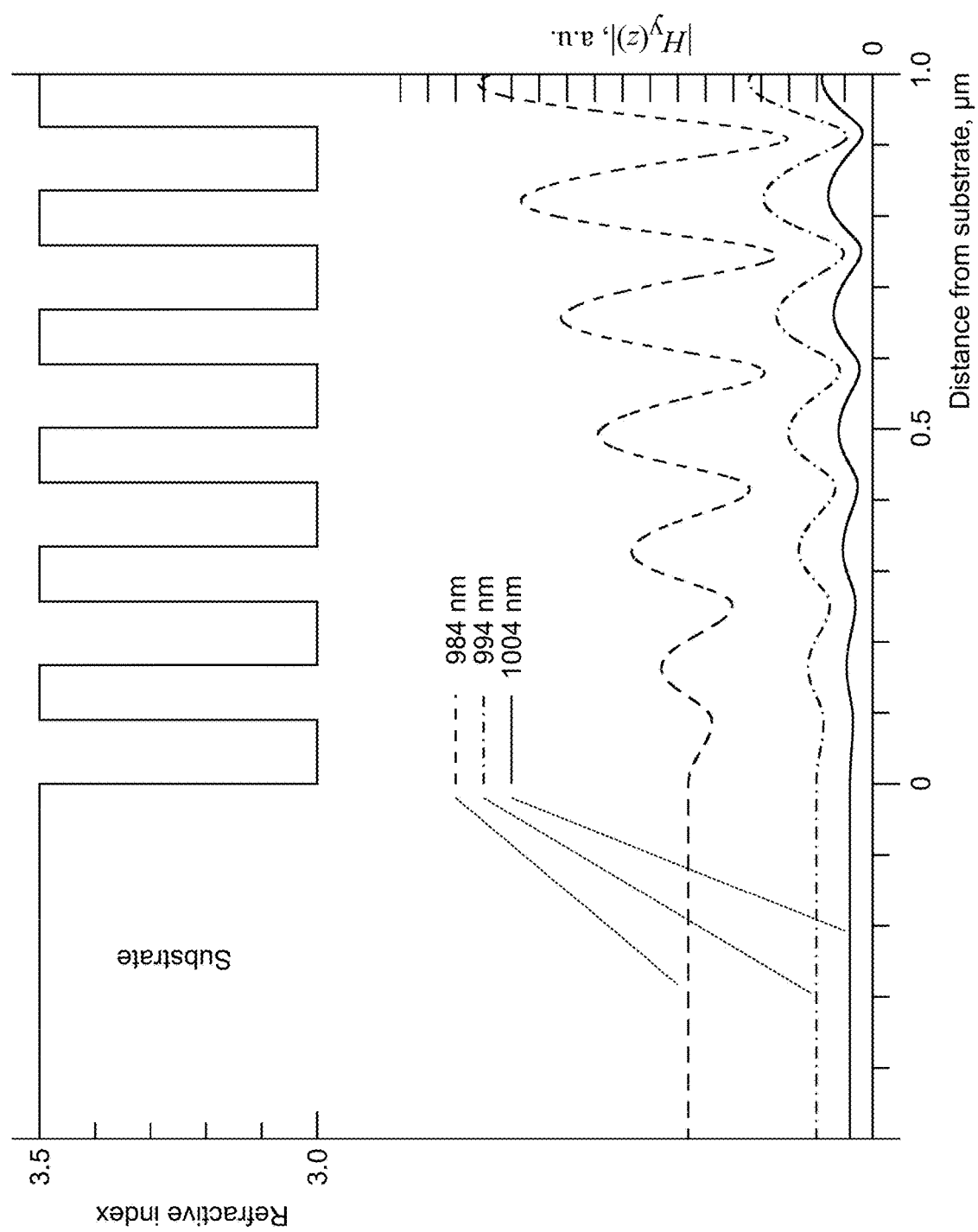
FIG. 7. Spatial profile of the magnetic field of the TM-polarized surface-trapped mode in the laser structure of FIG. 3 in the vicinity of the substrate at three wavelengths of light.

FIG. 7 depicts the profiles of $|H_y(z)|$ in the several first layers of the structure close to the substrate and in the substrate itself. The value in the substrate significantly increases upon a decrease in wavelength, which illustrates an increasing leakage loss to the substrate upon a decrease of the wavelength. A one skilled in the art will appreciate that the similar trend occurs for each non-vanishing component of the optical fields.

Figure 8:
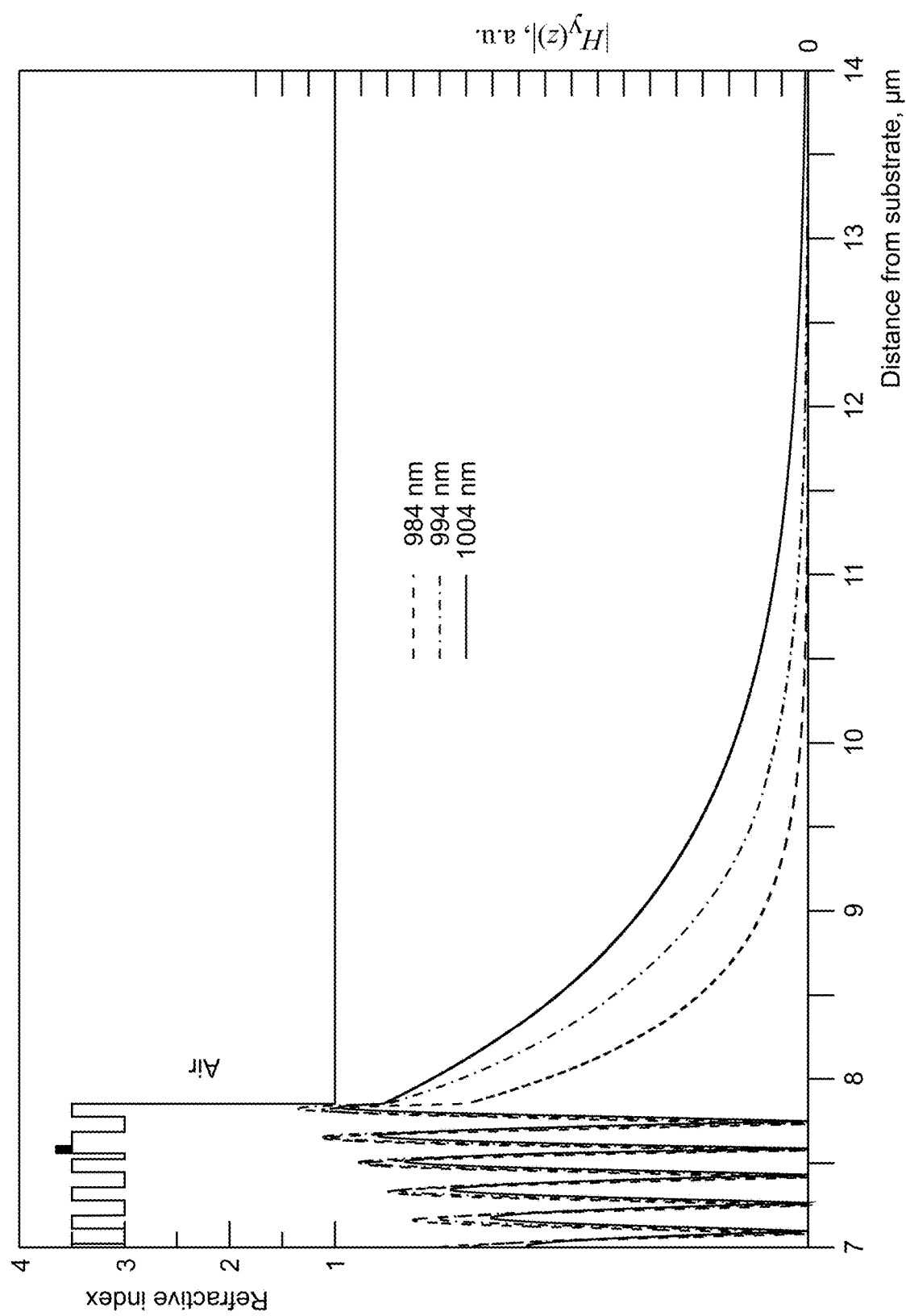
FIG. 8. Spatial profile of the magnetic field of the TM-polarized surface-trapped mode in the top part of the laser structure of FIG. 3 and in the air at three wavelengths of light.

FIG. 8 displays the profiles of $|H_y(z)|$ in the top part of the structure and in the air close to the top surface of the DBR.

Upon increase in wavelength, the field decays slower and is more extended to the air. This feature also implies that, upon increase in wavelength, the part of the optical power of the optical wave accumulated in the air, also increases.

It should be noted that the structure presented in FIGS. 5 through 8 contains a DBR bounded by air, and no resonant cavity. For example, vertical cavity surface emitting lasers (VCSELs) contain a resonant cavity having a thickness $$D_{cavity} = m \frac{\lambda}{2n_{cavity}}, \quad (2)$$

where m is an integer number, and a resonant cavity in a tilted cavity laser disclosed in U.S. Pat. No. 7,031,360 and U.S. Ser. No. 11/194,181, would have a thickness $$D_{cavity} = m \frac{\lambda}{2\sqrt{n_{cavity}^2 - 1}}. \quad (3)$$

No resonant cavity of this kind is present in the structure disclosed in the present patent application.

The strength of interaction of the optical mode with the active region is characterized by the optical confinement factor. The formula for the optical confinement factor for the TM-polarized optical mode was derived in the papers by Y.-Zh. Huang, Z et al. "Analysis of the optical confinement factor in semiconductor lasers," Journal of Applied Physics, volume 79, issue 3, pages 3827-3830 (1996), and T. D. Visser, et al., "Confinement factors and gain in optical amplifiers," IEEE Journal of Quantum Electronics, volume 33, issue 10, pages 1763-1766 (1997), whereas both papers are hereby incorporated herein in their entirety by reference. The optical confinement factor of the TM-polarized mode equals $$\Gamma_{TM} = \frac{n_{eff} \int_{active} n(z)[|E_x(z)|^2 + |E_z(z)|^2]dz}{\int_0^{+\infty} n^2(z)|E_z(z)|^2 dz}, \quad (4)$$

where the integration in the denominator is taken over the DBR structure and the air. It follows from Eq. (4) that a significant enhancement of the electric field in the air results in a decrease of $\Gamma_{TM}$.

Figure 9A:
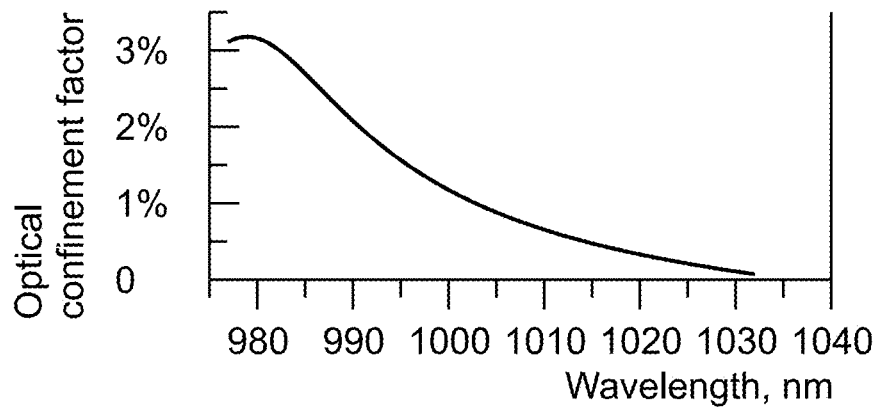
FIG. 9A. Optical confinement factor of the TM-polarized surface-trapped mode for the laser structure of FIG. 3 versus wavelength.

FIG. 9A illustrates the dependence of the optical confinement factor of the surface-trapped TM mode versus wavelength. The optical confinement factor in FIG. 9A drops with the wavelength increase as the mode becomes more and more extended into the air. Once the wavelength decreases, $\Gamma_{TM}$ first increases and then starts decreasing as the local maximum of the electric field shifts away from the active medium.

Figure 9B:
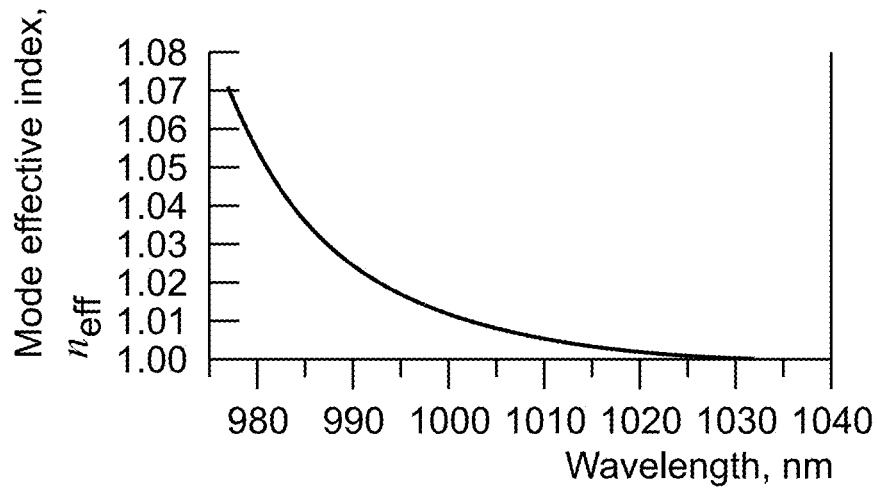
FIG. 9B. Effective mode index of the TM-polarized surface-trapped mode for the laser structure of FIG. 3 versus wavelength.

FIG. 9B illustrates the dependence of the effective mode refractive index versus wavelength. As, upon the wavelength increase the mode becomes more and more extended to the air, its index approaches the refractive index of the air, i. e. 1.

The latter has a strong implication on the facet reflectivity. The facet reflectivity of an uncoated facet, calculated in the Fresnel approximation equals $$R = \left(\frac{n_{eff} - 1}{n_{eff} + 1}\right)^2. \quad (5)$$

Figure 9C:
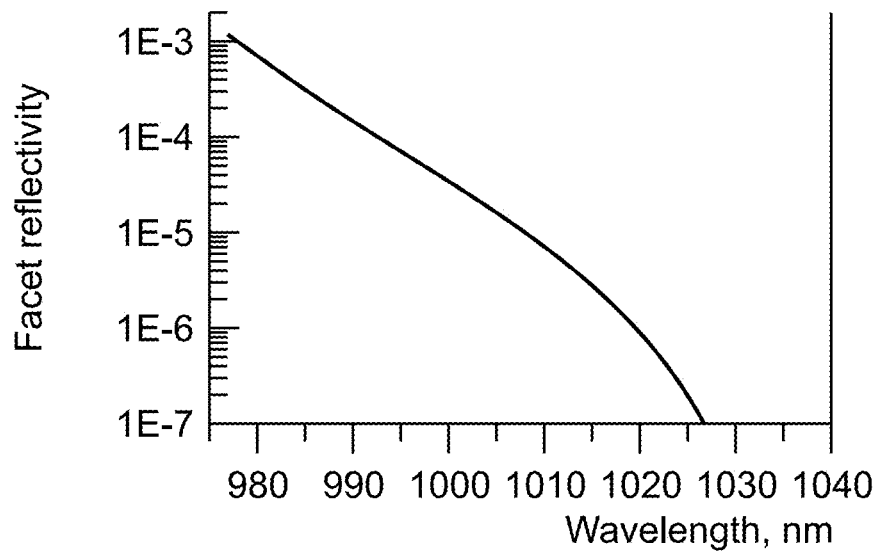
FIG. 9C. Reflectivity from the facet calculated in the Fresnel approximation for the TM-polarized surface-trapped mode for the laser structure of FIG. 3.

FIG. 9C displays the facet reflectivity calculated in the Fresnel approximation versus the wavelength. It follows from FIG. 9C that the facet reflectivity is below $10^{-3}$ and even below $10^{-4}$ and further even below $10^{-5}$ in a significant spectral range. Such values refer to extremely low reflectivity, usually attained by using an extremely anti-reflective coating in conventional edge-emitting lasers, semiconductor optical amplifiers, or semiconductor gain chips.

A one skilled in the art will agree, that the Fresnel approximation gives with a good accuracy the facet reflectivity for a conventional edge-emitting laser, in which the optical mode is entirely located within the semiconductor structure, and the effective mode index lies within the interval of the indices of the semiconductor materials, e. g., between 3.0 and 3.5. For the structure considered in FIG. 5 through FIG. 8 and the mode strongly extended to the air, the Fresnel approximation may be less accurate. However, once the surface-trapped mode becomes more and more extended to the air, until it vanishes and becomes radiative, the exact facet reflectivity also tends to zero. It means that the extremely low values of the facet reflectivity are reached also for the exact values of the facet reflectivity.

Figure 10A:
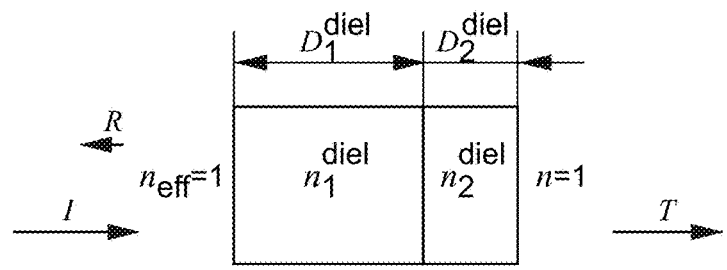
FIG. 10A. Schematics of an intermediate reflective two-layer coating.

Extremely low facet reflectivity, say, below $10^{-3}$, is advantageous for a semiconductor optical amplifier or for a semiconductor gain chip used in an external cavity system, where it is necessary to suppress lasing from an alone standing semiconductor chip. For using a structure as an edge-emitting laser, the front facet reflectivity should be preferably in a range of a few percent, e. g., between 0.5% and 3%. FIG. 10A suggests a specific coating which increases the facet reflectivity from an ultralow level below $10^{-3}$ to a preferred value of few percent. Such coating can be termed intermediate reflective coating. Such coating is a specific coating for using with an edge-emitting laser operating in a surface-trapped optical mode.

One should note that a conventional semiconductor edge-emitting laser typically generates an optical mode having an effective mode index within the interval of the refractive indices of semiconductor materials, say, between 3.0 and 3.5. The reflectivity of an as-cleaved, uncoated facet equals approximately ~0.3. Then a high reflective coating is applied to the rear facet to increase its reflectivity to a level >95%, or, more preferably, to a level >98%. An anti-reflective coating is applied to a front facet to decrease its reflectivity to a level of several percent, e. g., between 0.5% and 3%. Intermediate reflective coating is specifically needed if a laser is configured to operate in a surface-trapped mode.

FIG. 10A illustrates schematically an intermediate reflective coating as a structure consisting of two layers, a first dielectric layer having a thickness $D_1^{diel}$ and a refractive index $n_1^{diel}$ and a second dielectric layer having a thickness $D_2^{diel}$ and a refractive index $n_2^{diel}$. Light is impinging (I) from the medium with the refractive index 1, is partially reflected (R) and partially transmitted (T). As an example, a particular set of materials is considered, amorphous $SiO_2$ having a refractive index $n_1^{diel}=1.45$ and an amorphous $Ta_2O_5$ having a refractive index $n_2^{diel}=2.25$.

Figure 10B:
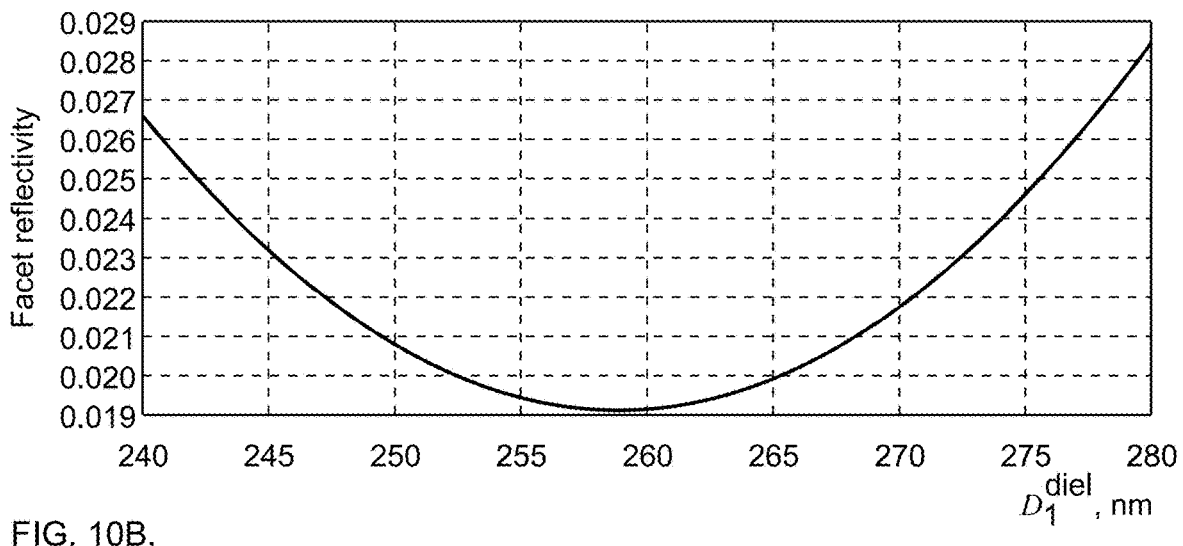
FIG. 10B. Reflectivity of a facet covered by an intermediate reflective two-layer coating of FIG. 10A versus the thickness of the first layer.

The modeled coating has the thickness of the first layer $D_1^{diel}=260$ nm and the thickness of the second layer $D_2^{diel}=31$ nm. FIG. 10B displays the facet reflectivity as a function of a varied thickness of the first layer.

Figure 10C:
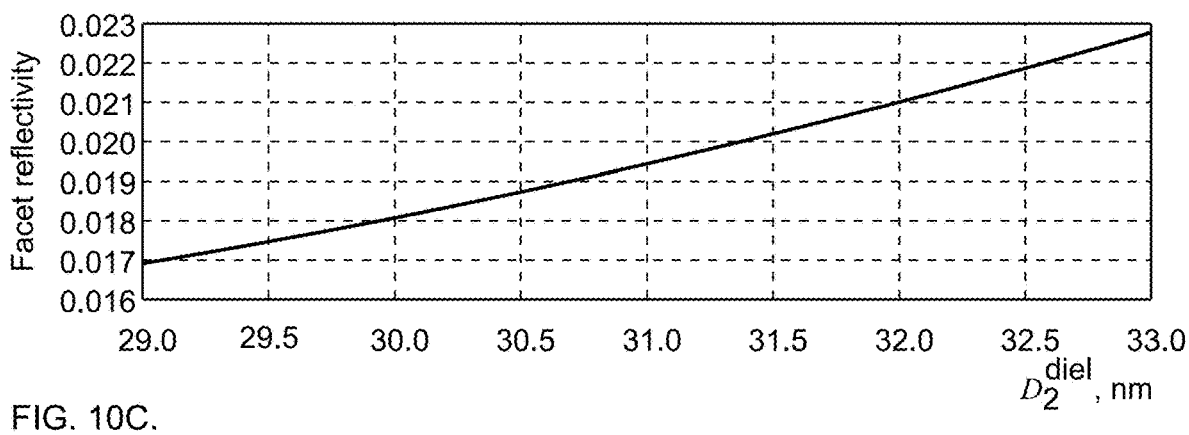
FIG. 10C. Reflectivity of a facet covered by an intermediate reflective two-layer coating of FIG. 10A versus the thickness of the second layer.

FIG. 10C displays the facet reflectivity as a function of a varied thickness of the second layer.

Figure 10D:
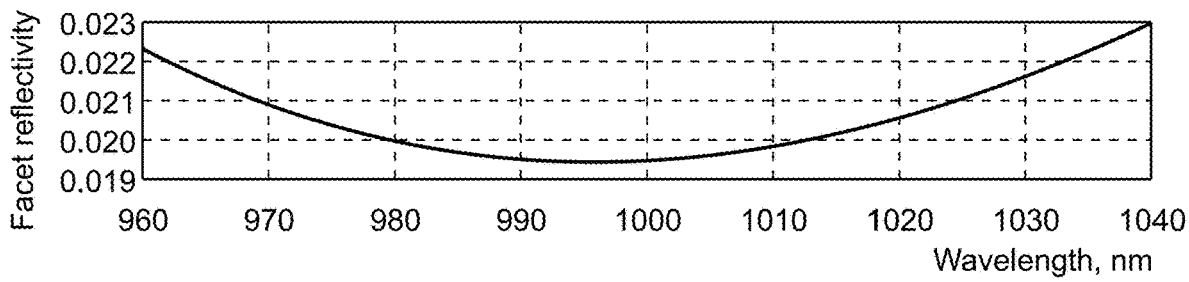
FIG. 10D. Reflectivity of a facet covered by an intermediate reflective two-layer coating of FIG. 10A versus wavelength.

FIG. 10D shows the facet reflectivity as a function of the wavelength of light.

It follows from FIGS. 10B through 10D that such intermediate reflective coating provides the facet reflectivity about 2% within a reasonable tolerances of thicknesses ~5% and within a sufficient spectral interval of ~40 nm.

Figure 11:
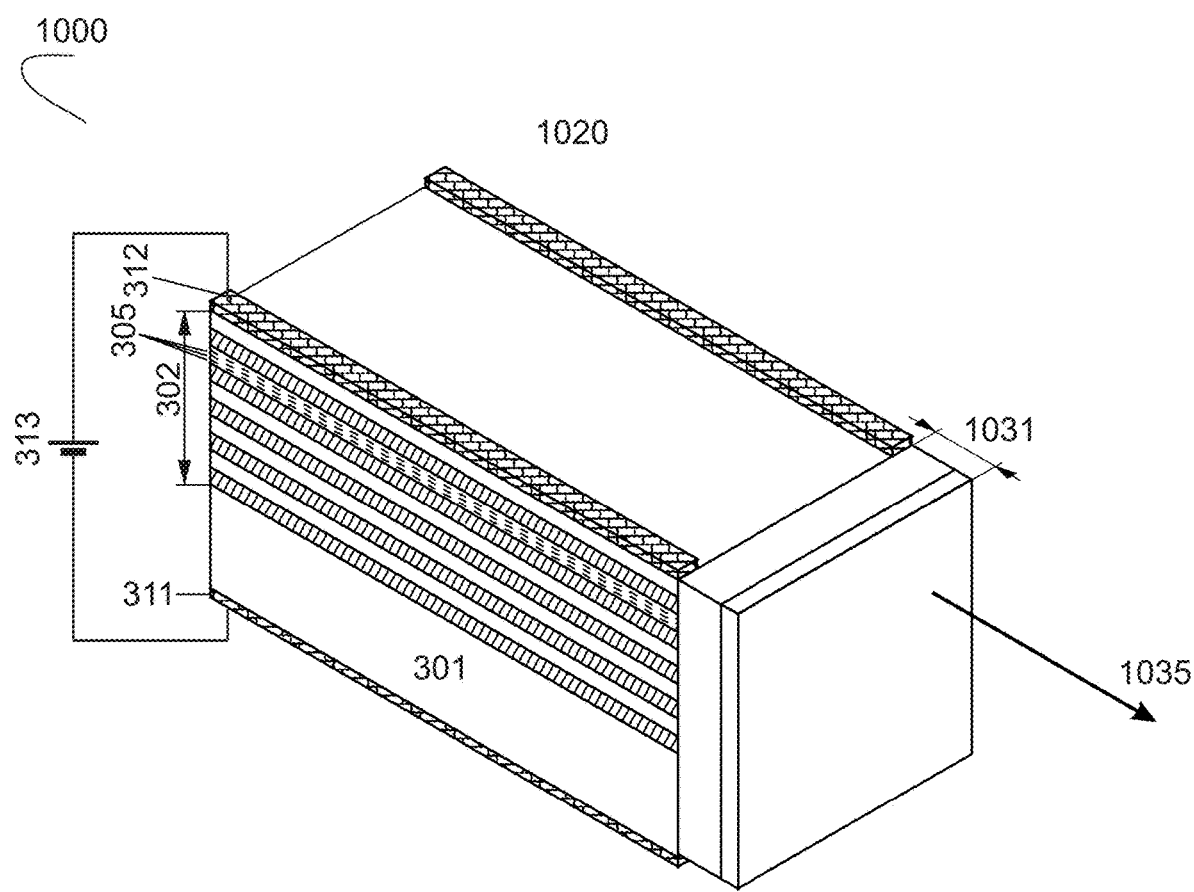
FIG. 11. Perspective view of an edge-emitted laser bounded from the top by air with a front facet covered by an intermediate reflective coating, according to another embodiment of the present invention.

FIG. 11 shows schematically an edge-emitting laser (1000) according to yet another embodiment of the present invention. The laser (1000) operates in a surface-trapped optical mode, like the laser (300) in FIG. 3, but is bounded from the top not by a dielectric but by air (1020). An intermediate reflective coating (1031) is mounted on the front facet of the laser (1000), and the device emits laser light (1035) through the coating (1031).

It should be noted that if the DBR is bounded from the top not by the air, but by a dielectric, an as-cleaved uncovered facet also exhibits strong anti-reflective properties. For example, if the top dielectric material is SiO2 with the refractive index 1.45, Eq. (5) gives 3.4% of the facet reflectivity.

To determine the wavelength and current density at which the lasing starts we consider the criterion of the lasing threshold $$\Gamma_{TM} g_{th} = \alpha_{leakage} + \alpha_{abs}^{modal} + \frac{1}{2L} \ln\left(\frac{1}{R_1 R_2}\right), \quad (6)$$

where $g_{th}$ is the threshold material gain in the QWs, L is the chip length, and $R_1$ and $R_2$ are the reflectivities of the front and the rear facets, respectively. The leakage loss to the substrate is related to the outgoing wave in the substrate, $$\alpha_{leakage} = \frac{\text{Im}\{H_y(z)[dH_y^*(z)/dz]\}|_{substrate}}{n_{eff} n_1^2 k_0 \int_0^{+\infty} n^{-2}(z)|H_y(z)|^2 dz}. \quad (7)$$

The modal absorption loss is connected with the absorption coefficient in the material α(z) via an integral similar to (5), $$\alpha_{abs}^{modal} = \frac{n_{eff} \int_0^{z_0} \alpha(z) n(z) [|E_x(z)|^2 + |E_z(z)|^2] dz}{\int_0^{+\infty} n^2(z) |E_z(z)|^2 dz}, \quad (8)$$

where z=0 refers to the substrate level and $z=z_0$ is the top surface of the semiconductor structure. The absorption coefficient in the semiconductor materials is assumed α(z)=1 cm$^{-1}$.

To evaluate external loss of the last term on r. h. s. of Eq. (4) we consider a chip length L=4 mm, a high reflective coating on the rear facet $R_2$≈1 and an intermediate reflective coating on the front facet $R_1$≈0.02. To address the threshold current density we apply a logarithmic dependence of the gain in QWs versus current density $$g(J) = g_0 \ln\left(\frac{J}{J_0}\right). \quad (9)$$

Parameters of Eq. (9) for the quantum wells emitting at wavelengths ~1 μm are extracted from experimental data given in the paper by P. Crump, et al., "975 nm high power diode laser with high efficiency and narrow vertical far field enabled by low index quantum barriers," Applied Physics Letters, volume 96, issue 13, paper 131110 (2010), whereas the paper is hereby incorporated herein in its entirety by reference. Extracted values are go 1190 cm$^{-1}$ and $J_0$=203 A/cm$^2$.

FIGS. 12A through 12D analyze properties of the surface-trapped TM mode over the spectral range, in which such mode exists for three values of the thickness of the top layer, namely for the ideal DBR where $d_{top}$=$d_1$ and for DBRs with a thinner top layer, $d_{top}$=0.9$d_1$ and $d_{top}$=0.8$d_1$. The optical confinement factor in FIG. 12A drops with the wavelength increase as the mode becomes more and more extended into the air. Once the wavelength decreases, $\Gamma_{TM}$ first increases and then starts decreasing as the local maximum of the electric field shifts away from the active medium.

Figure 12A:
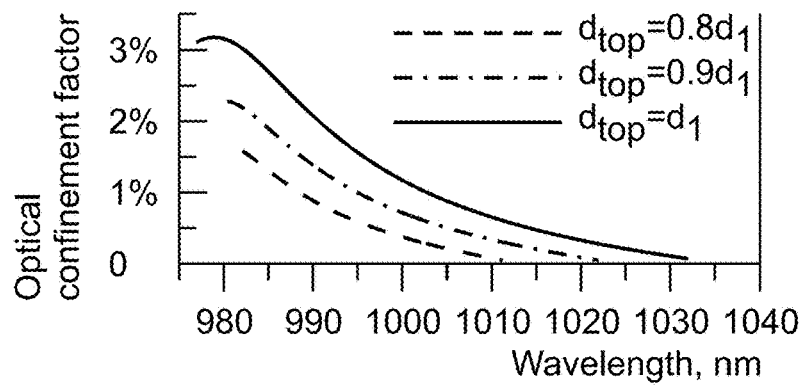
FIGS. 12A through 12D represent characteristics of the TM-polarized surface-trapped optical mode of the laser of FIG. 11, calculated for three values of the top layer thickness.
Figure 12B:
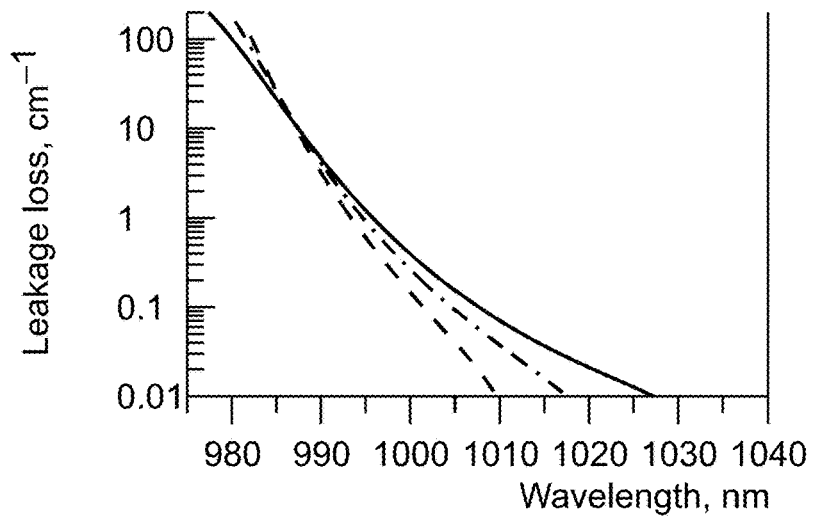

The leakage loss in FIG. 12B drops, along with $\Gamma_{TM}$ as the wavelength increases and the mode extends more and more into the air. Upon decreasing wavelength, the leakage loss increases significantly as the wavelength approaches the shortwavelength edge of the DBR stopband, the DBR becomes transparent, and the surface-trapped mode merges with a bulk mode of the substrate.

Figure 12C:
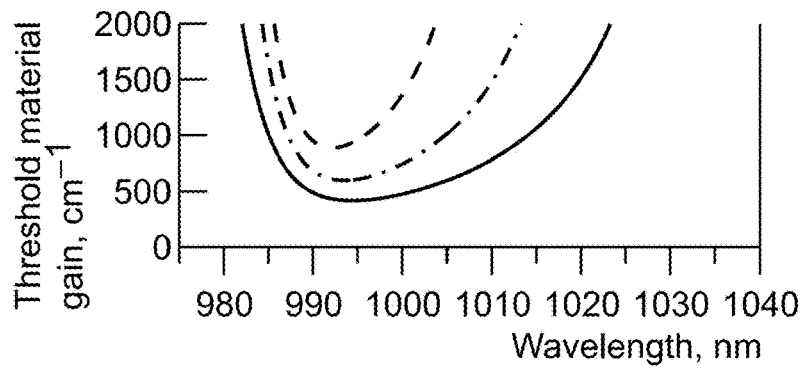
Figure 12D:
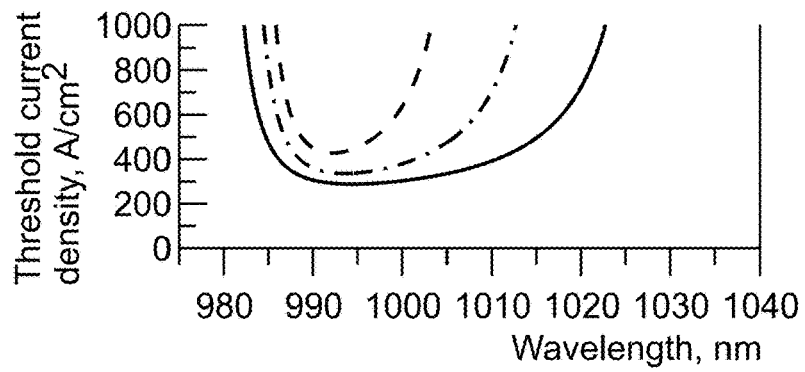

The threshold material gain, according to Eq. (6) is governed by the wavelength dependencies of the optical confinement factor and of the total loss. As the wavelength increases, the main loss is the external loss, practically independent of the wavelength, the optical confinement factor $\Gamma_{TM}$ drops, and the threshold material gain rapidly increases. As the wavelength decreases, approaching the shortwavelength edge of the stopband, $\Gamma_{TM}$ depends only weakly on λ, while the leakage loss to the substrate increases drastically, leading to a rapid increase of the threshold material gain. FIGS. 12C and 12D demonstrate well pronounced minima in the threshold material gain and in the threshold current density, respectively, as functions of the wavelength.

Figure 13D:
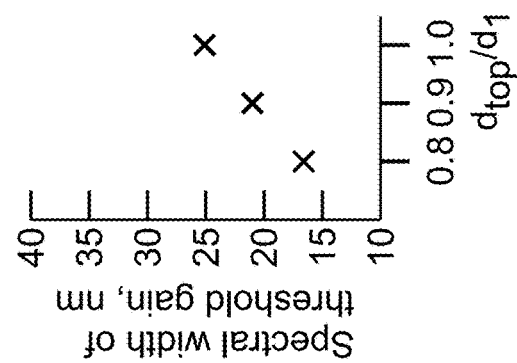
FIGS. 13A through 13D depict parameters of the TM-polarized surface-trapped modes at the lasing threshold, calculated for the same three values of the top layer thickness, as in FIGS. 12A through 12D.
Figure 13C:
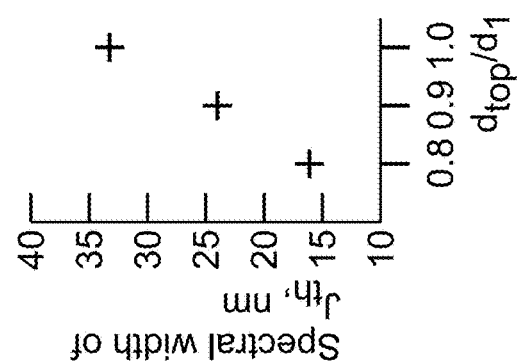
Figure 13B:
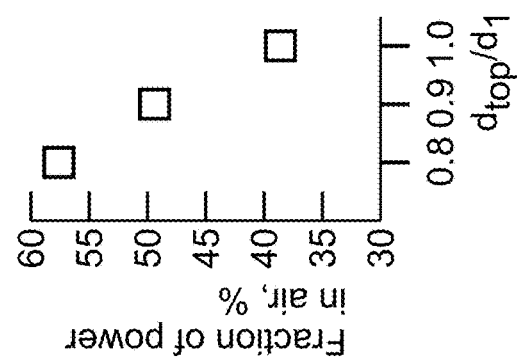
Figure 13A:
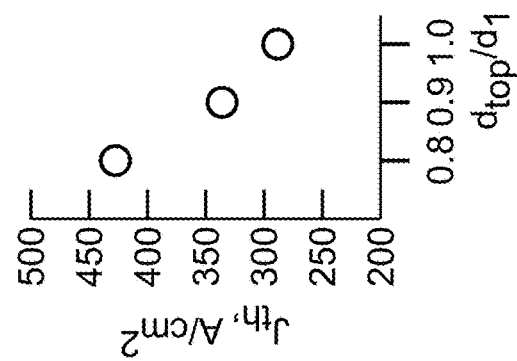

FIG. 13A depicts the threshold current density $J_{th}$ for laser structures with three different thicknesses of the top layer. Upon decrease of $d_{top}$ from $d_1$ to 0.8$d_1$ $J_{th}$ increases due to lowering of the optical confinement factor as in FIG. 12A.

FIG. 13B shows the fraction of the optical power $\int\{\varepsilon(z)[|E_x(z)|^2+|E_z(z)|^2]+|H_y(z)|^2\}dz$ accumulated in the air. This fraction increases from ~39% for the top layer thickness $d_{top}$=$d_1$ to ~58% for the top layer thickness $d_{top}$=0.8$d_1$.

To characterize the dependence of the threshold gain and threshold current density on the wavelength (FIGS. 12C and 12D) it is convenient to define the spectral width, within which the values $g_{th}$ and $J_{th}$ exceed their minimum values not more than by a factor of 2. The spectral widths of $J_{th}$ curves in FIG. 13C are larger, and those of $g_{th}$ in FIG. 13D are generally smaller, due to the specific logarithmic behavior of the material gain in the quantum wells (9). FIG. 13D displays the spectral widths varying from 25 nm for the top layer thickness $d_{top}$=$d_1$ down to 21 nm for $d_{top}$=0.9$d_1$ and 17 nm for $d_{top}$=0.8 $d_1$.

Since material gain spectrum of the QWs is rather broad, the lasing wavelength at the threshold is governed by the minimum in the threshold current density in FIG. 12D. Similar effects occur in the tilted cavity lasers, where the optical confinement factor is nearly wavelength-independent, and the leakage loss through the specially designed MIR has a minimum as a function of λ, with a comparable spectral width 20-25 nm for the same lasing wavelengths ~1

μm, which is reported in the paper by V. Shchukin, et al. "Tilted cavity laser (Critical review lecture)," Proceedings of SPIE, volume 5509, pages 61-71 (2004), whereas the paper is hereby incorporated herein in its entirety by reference. A one skilled in the art will appreciate that the observed wavelength-stabilized behavior of the tilted cavity laser suggests, that the laser based on a surface-trapped mode disclosed in the present application will also exhibit similar wavelength-stabilized operation.

Figure 14:
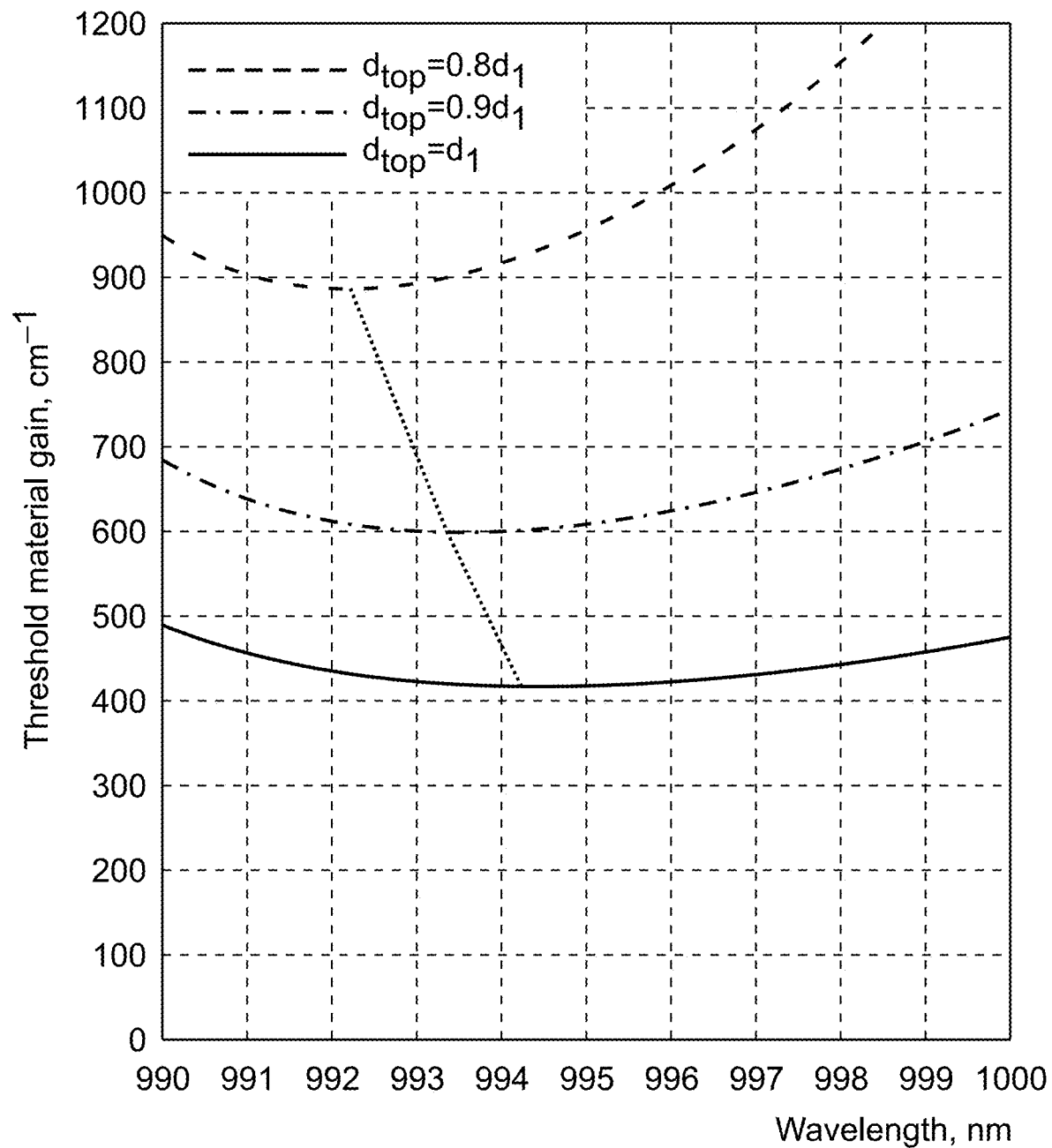
FIG. 14 displays the threshold material gain in the quantum wells versus wavelength of a surface-trapped TM polarized mode for three different thicknesses of the top layer, showing a shift of the wavelength versus thickness.

A change in the top layer thickness leads to a shift of the wavelength, at which the threshold material gain and the threshold current density is minimum, i. e. a shift of the wavelength, at which lasing starts. FIG. 14 depicts such a shift showing that an increase in the top layer thickness by $0.1 d_1$ leads to an increase in wavelength by ~1 nm.

A change in the top layer thickness, from $\sim 0.8 d_1$ to $d_1$ is about 14 nm, which indicates that it is certainly possible with the present epitaxial technology, to meet this interval of thicknesses and, furthermore, a targeted thickness within this interval. Additional possibility of adjustment includes depositing a thin layer of a dielectric. For example, $Si_xN_y$ with the index n*~2 can be used. To keep the same optical thickness of the deposited layer, the dielectric layer used for adjustment will be $\sqrt{(n_1^2-1)/(n^{*2}-1)} \approx 1.9$ times thicker than the corresponding semiconductor layer, which makes adjustment even easier. Furthermore, by varying the thickness of the deposited dielectric layers across the semiconductor wafer one can realize multiwavelength devices on the same wafer.

Figure 21:
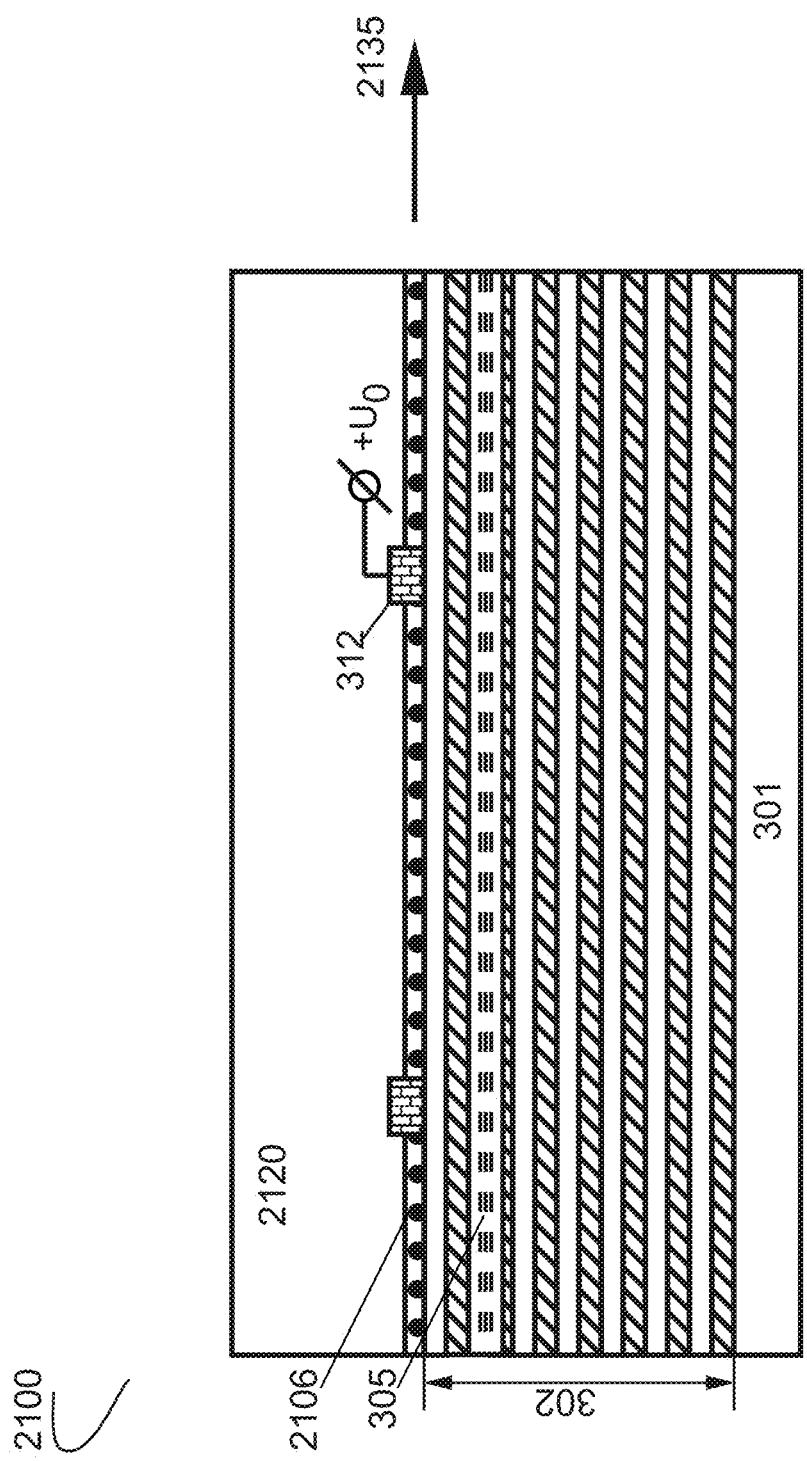
FIG. 21 shows an edge-emitting laser based on a surface-trapped mode, with an additional dielectric layer on top to adjust the lasing wavelength, according to a further embodiment of the present invention.

FIG. 21 shows an edge-emitting laser (2100), in which the DBR (302) is bounded from the top by the dielectric (2120) and has, additionally to the laser (300) of the embodiment of FIG. 3 an additional dielectric layer (2106). The additional dielectric layer (2106) serves to adjust the wavelength of light (2135) emitted by the device.

One of key important implications of the wavelength-stabilized operation of a laser is a significantly reduced thermal shift of the lasing wavelength as compared to that in a conventional edge-emitter. To address the effect of temperature on the surface-trapped mode, we assume that the gain spectrum of the active medium is much broader than the spectral widths in FIGS. 12C and 12D. Then, despite a rapid shift of the gain spectrum with temperature, the shift of the lasing wavelength is governed by the shift of the minimum of the threshold current density in FIG. 12D. To address this shift we apply experimentally measured thermal coefficients of the refractive indices dn/dT. Namely, we use the thermal coefficient of GaAs $dn/dT = 3.66 \times 10^{-4}$ $K^{-1}$ for material 1 and for QWs and the thermal coefficient of AlAs $dn/dT = 1.63 \times 10^{-4}$ $K^{-1}$ for material 2. These thermal coefficients were measured and reported in the paper by J. Talghader, et al., "Thermal dependence of the refractive index of GaAs and AlAs measured using semiconductor multilayer optical cavities," Applied Physics Letters, volume 66, issue 3, pages 335-337 (1995), and in Erratum, Applied Physics Letters, volume 69, issue 17, page 2608 (1996), whereas both publications are hereby incorporated herein in their entirety by reference.

Figure 15A:
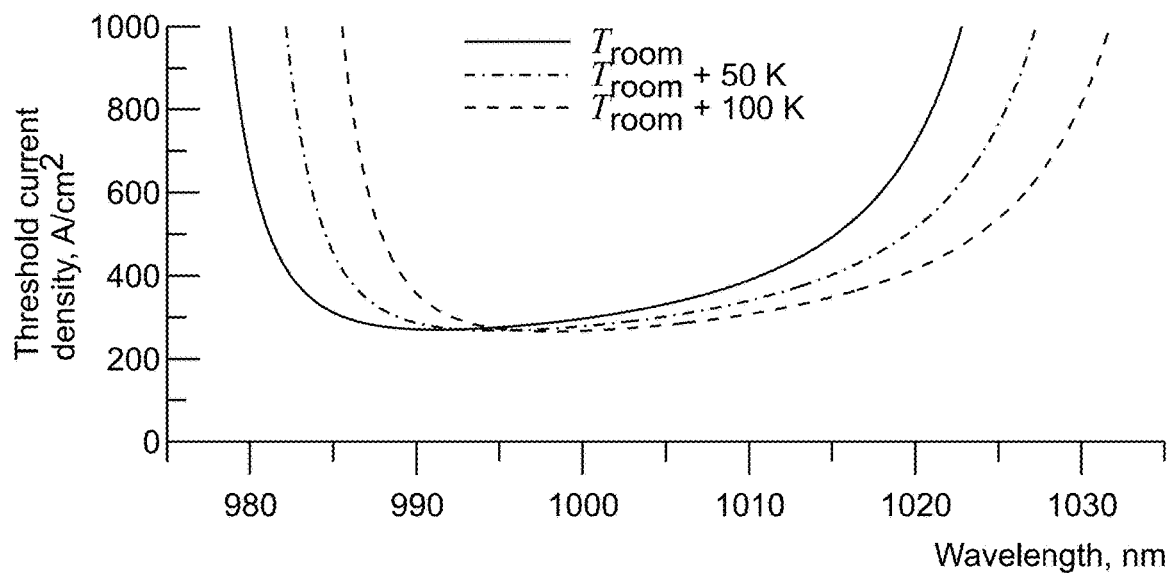
FIG. 15A displays the threshold current density versus wavelength of the laser operating in a TM-polarized surface-trapped optical mode, calculated for three different temperatures.
Figure 15B:
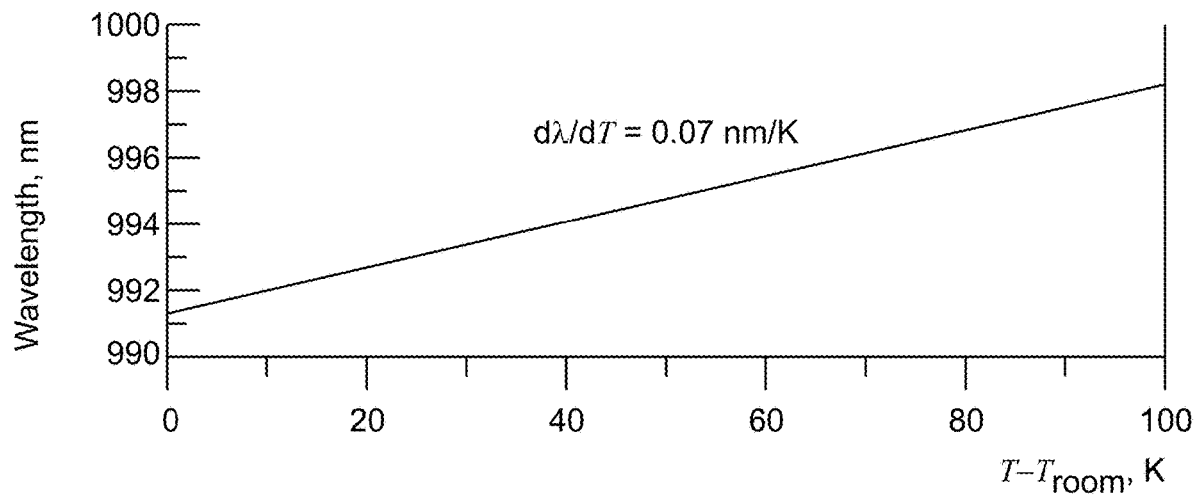
FIG. 15B shows the thermal shift of the lasing wavelength.

FIG. 15A displays the threshold current density for the structure with the top layer thickness $d_{top} = d_1$ calculated for three temperatures, and FIG. 15B shows a shift of the lasing wavelength versus temperature at a rate $d\lambda/dT = 0.07$ nm/K. Modeling of the structures with smaller thickness of the top layer yield the same thermal shift of the lasing wavelength. This reduced thermal shift confirms the wavelength-stabilized operation of the laser based on a surface-trapped optical mode.

The features FIGS. 12A through 15B of a laser based on a surface-trapped optical mode are related to the positioning of the active medium close to the surface of a semiconductor DBR, i. e. close to the air or to an adjacent dielectric. In FIG. 6 the active region is placed in the third semiconductor layer from the top. Anyway, placing of the active region at a distance from the top surface non exceeding 0.5 micrometers is preferable.

A one skilled in the art will appreciate that various types of the active medium can be employed in the device. Apart of multiple quantum wells as in the embodiment of FIGS. 5 through 8, a single or multiple sheet of quantum wires can be used. Further, a single or multiple sheet of quantum dots can serve as an active medium, too. A bulk material in the form of a double heterostructure can also be used as an active medium. Depending on a particular configuration of the device any combination of a double heterostructure, quantum wells, wires or dots can be applied.

Once a particular embodiment of a semiconductor laser is discussed in connection to the embodiment of FIGS. 5 through 8, i. e. to a laser emitting at ~1 μm, the active region formed of three quantum wells is assumed, and parameters of the compressively strained Ga(1-y)In(y)As quantum wells are taken from Crump (2010). For other targeted wavelengths of light other types of semiconductor materials can be used for both active medium and for the DBR. Possible materials include, but are not limited to III-V materials and related semiconductor alloys, III-N materials and related semiconductor alloys, II-VI materials and related semiconductor alloys, group IV semiconductors and related semiconductor alloys as well as any combination thereof.

Figure 16:
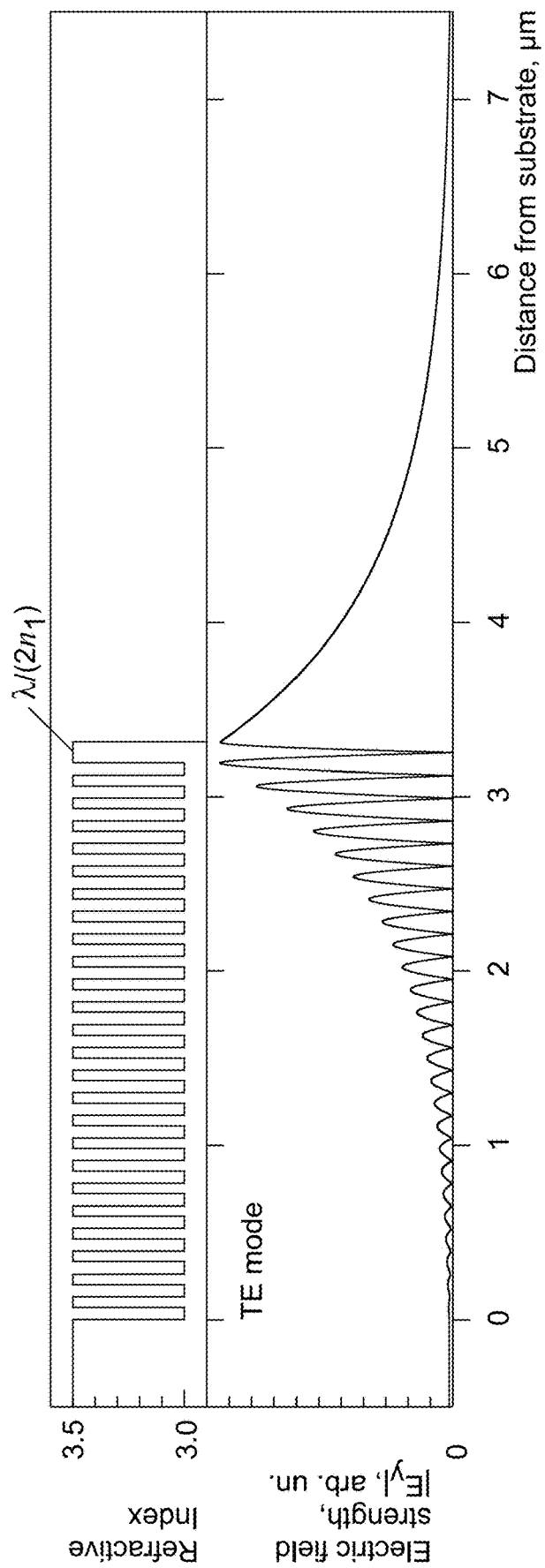
FIG. 16 displays the refractive index profile and the electric field strength profile of a TE-polarized surface-trapped optical mode for a DBR structure containing an effective lambda-half layer on top.

It was noted in the parent patent application Ser. No. 16/364,180, that the DBR having a perfect periodicity and thus, the top layer thickness equal $d_{top} = d_1$ does not localize at the surface a TE-polarized optical mode. It was however shown, that a significant increase in the top layer thickness, and using a layer with a thickness $d_{top} = \lambda_0/(2n_1)$ allows to localize a TE-polarized surface-trapped mode. FIG. 16 shows a refractive index profile of a DBR with the top layer having an increased thickness and the electric field profile $|E_y(z)|$ of the TE-polarized surface-trapped mode. Figure is similar to FIG. 14 from the parent patent application Ser. No. 16/364,180.

Figure 17:
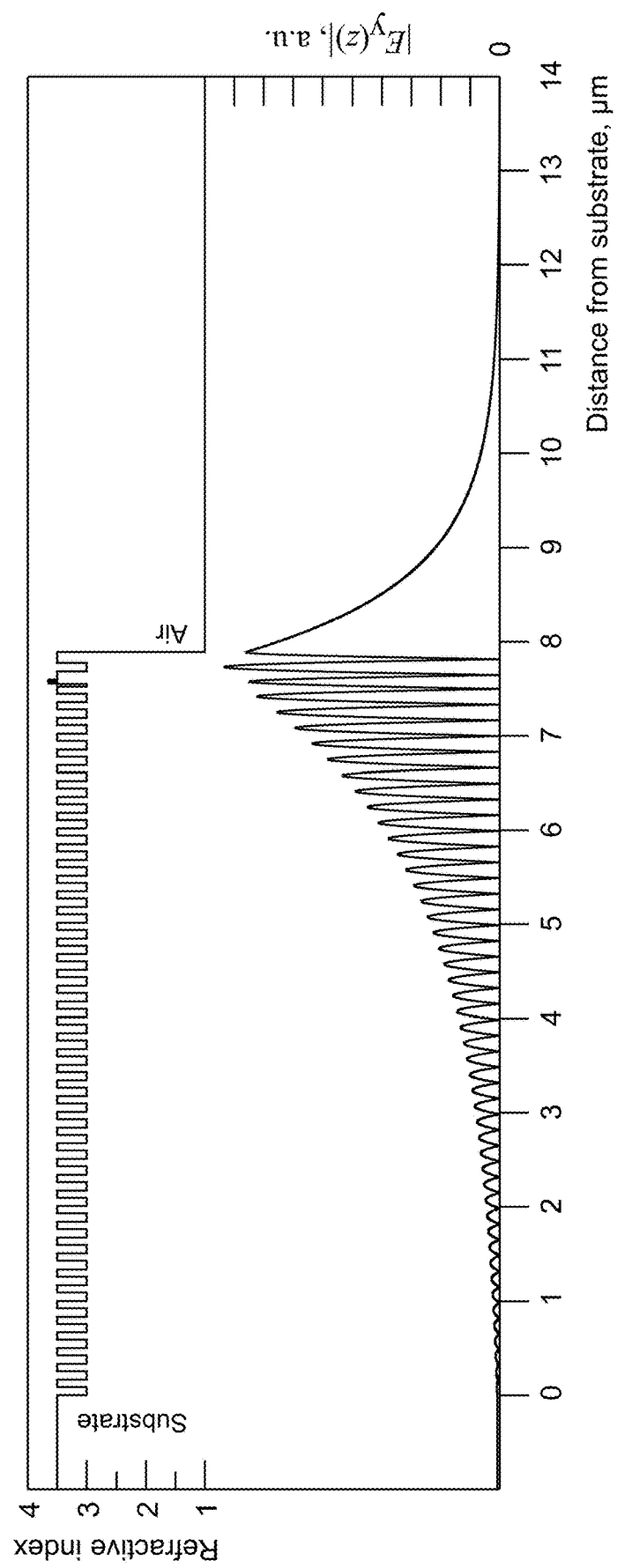
FIG. 17 shows the refractive index profile and the electric field strength profile of a TE-polarized surface-trapped optical mode for a laser according to yet another embodiment of the present invention.

To model TE-polarized modes, which obey the wave equation for the single non-vanishing component of the electric field $E_y(z)$ $$-\frac{d^2}{dz^2}E_y(z) - \left(\frac{2\pi}{\lambda}\right)^2 n^2(z) E_y(z) = -\left(\frac{2\pi}{\lambda}\right)^2 n_{\text{eff}}^2 E_y(z), \quad (10)$$

a laser multilayer structure similar to that of FIG. 5 is considered, with a single difference in the thickness of the top layer. The top layer thickness equals $d_{top} = (\frac{3}{8})\lambda_0/n_1 = 1.5 d_1$. FIG. 17 shows a refractive index profile and the electric field strength profile $|E_y(z)|$ of the TE-polarized mode in such structure.

Figure 18:
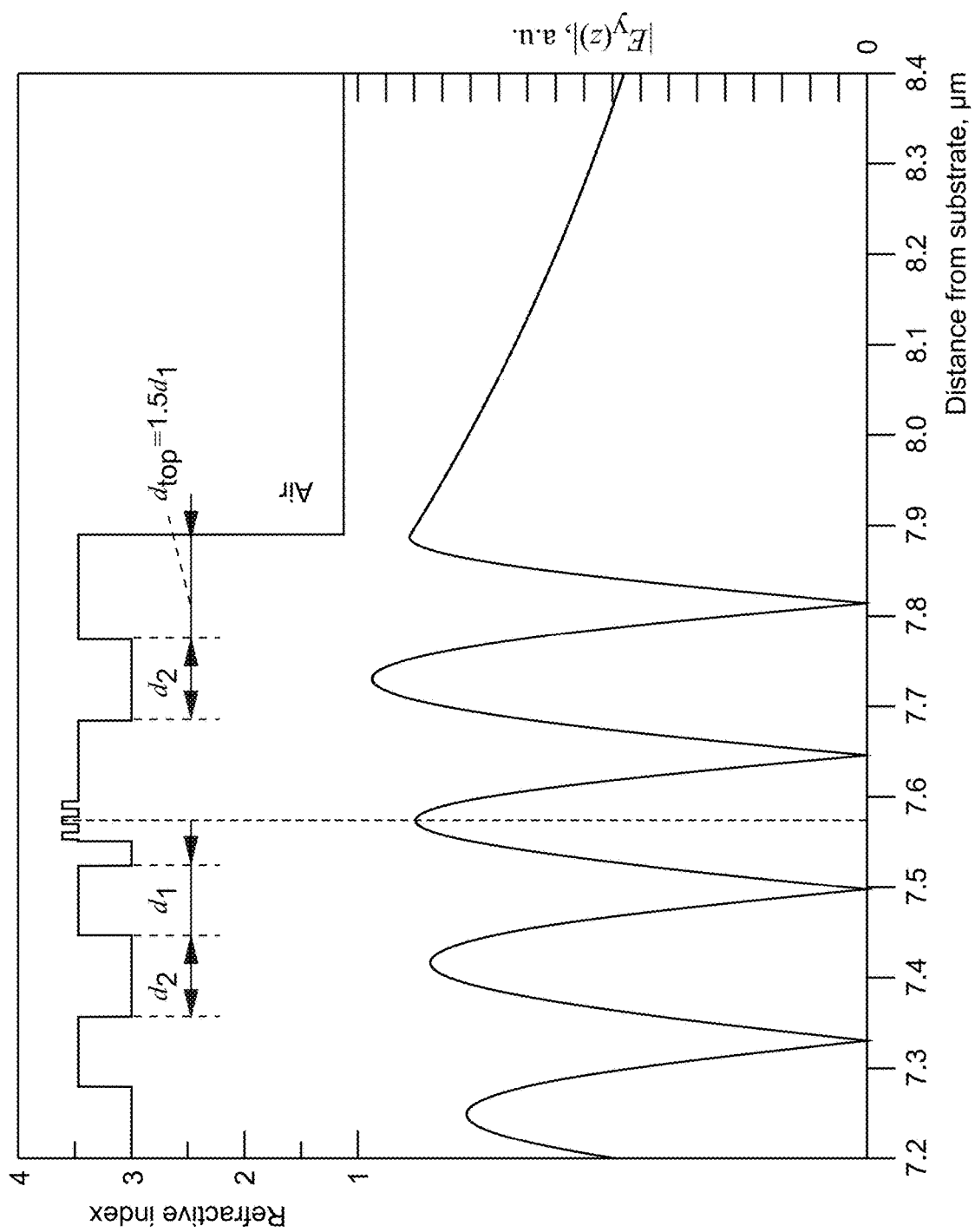
FIG. 18 displays the refractive index profile and the electric field strength profile of a TE-polarized surface-trapped optical mode for a laser of the embodiment of FIG. 16, at a larger magnification, showing the refractive index and electric field profiles in the vicinity of the active medium.

FIG. 18 displays the refractive index profile and the electric field strength profile of this structure at a larger magnification in the vicinity of the active region, demonstrating that the quantum wells are positioned at a local maximum of $|E_y(z)|$.

FIGS. 19A through 19D analyze properties of the surface-trapped TE mode over the spectral range, in which such mode exists for three values of the thickness of the top layer, namely for $d_{top}=1.5d_1$, $d_{top}=1.45\,d_1$ and $d_{top}=1.4\,d_1$. Optical confinement factor of the TE-polarized mode is given by the formula $$\Gamma_{TE} = \frac{\int_{active} n(z)|E_y(z)|^2 dz}{n_{eff}\int_0^{+\infty}|E_y(z)|^2 dz}, \tag{11}$$

leakage loss of the TE-polarized mode equals $$\alpha_{leakage} = \frac{\text{Im}\{E_y(z)[dE_y^*(z)/dz]\}|_{subtrate}}{n_{eff}k_0\int_0^{+\infty}|E_y(z)|^2 dz}, \tag{12}$$

and absorption loss equals $$\alpha_{abs}^{modal} = \frac{\int_0^{z_0} \alpha(z)n(z)|E_y(z)|^2 dz}{n_{eff}\int_0^{+\infty}|E_y(z)|^2 dz}. \tag{13}$$

Figure 19A:
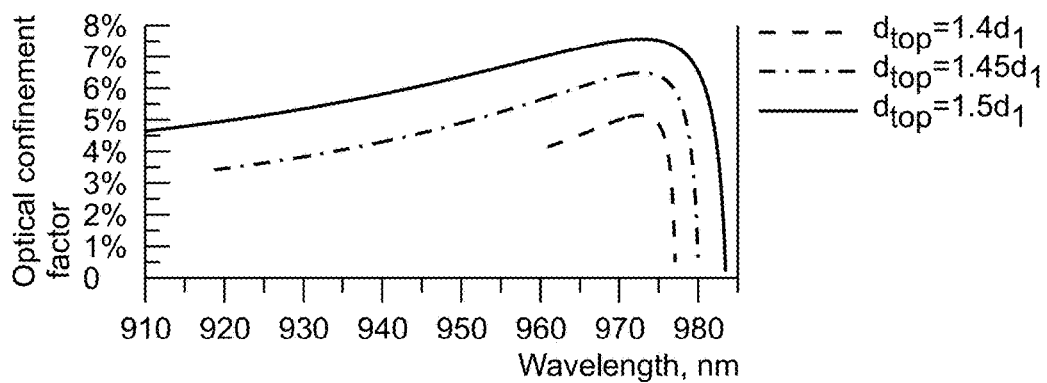
FIGS. 19A through 19D represent characteristics of the TE-polarized surface-trapped optical mode of the laser of FIGS. 17 and 18, calculated for three values of the top layer thickness.

The dependence of the optical confinement factors of the TE modes versus wavelength presented in FIG. 19A is different from that of the TM modes in FIG. 12A. Since there is no z-component of the electric field for the TE modes, there is no field enhancement in the air. Hence, the optical confinement factors are larger for TE modes and their drop upon increasing wavelength occurs only in a narrow spectral interval ~10 nm before the surface-trapped mode becomes radiative and vanishes.

Figure 19B:
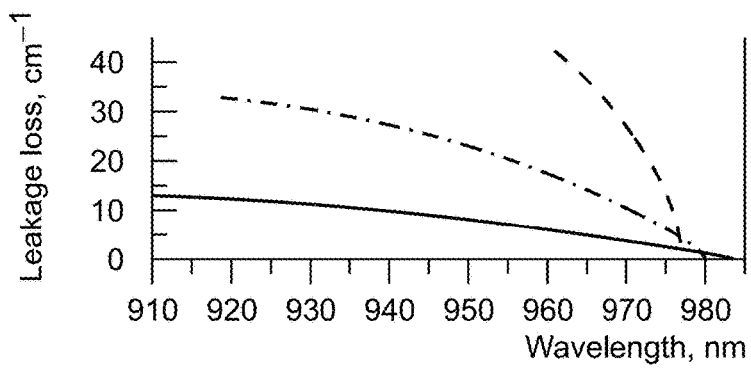

Leakage loss of the TE modes in FIG. 19B shows even stronger difference from that of the TM modes in FIG. 12B as the leakage loss increase upon decreasing wavelength is not as steep as for the TM modes.

Figure 19C:
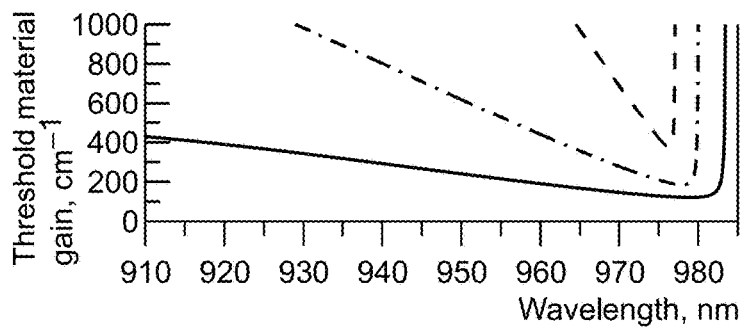
Figure 19D:
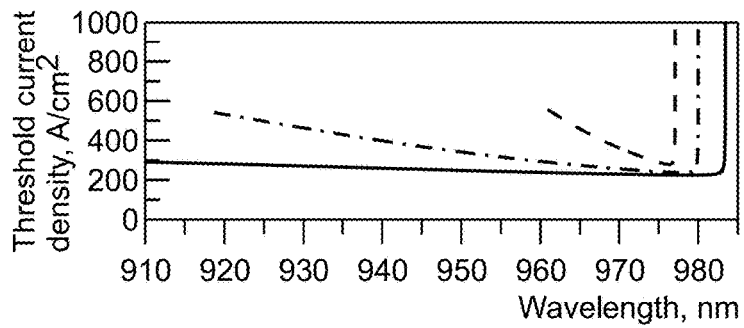

Correspondingly, the threshold material gain in FIG. 19C and the threshold current density in FIG. 19D versus wavelength demonstrate a very steep increase at longer wavelengths once the surface-trapped mode is close to vanishing. At shorter wavelengths and both $g_{th}$ and $J_{th}$ represent smooth curves with shallow minima.

Figure 20D:
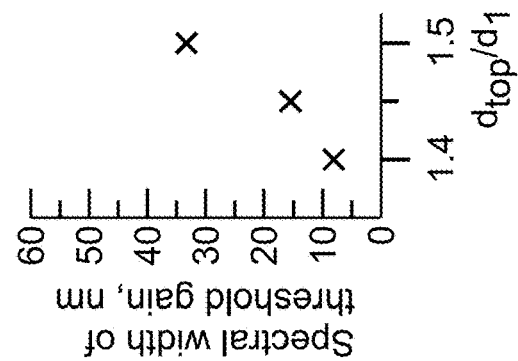
FIGS. 20A through 20D depict parameters of the TE-polarized surface-trapped modes at the lasing threshold, calculated for the same three values of the top layer thickness, as in FIGS. 19A through 19D.
Figure 20C:
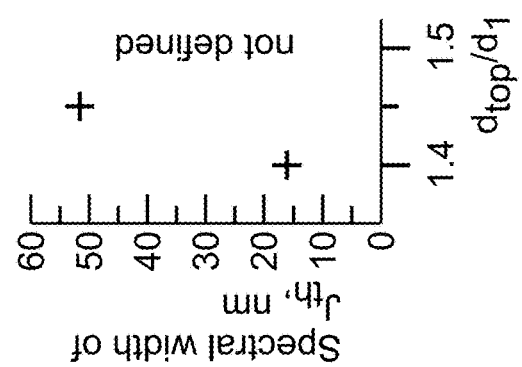
Figure 20B:
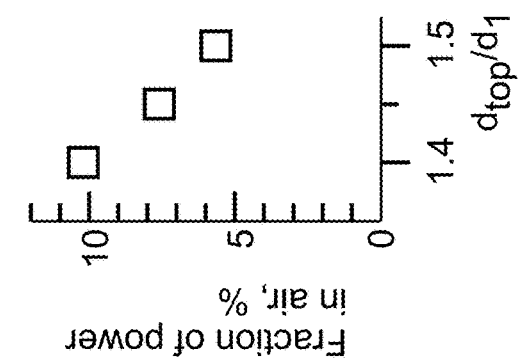
Figure 20A:
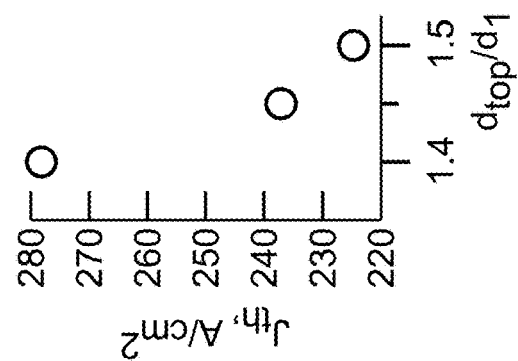

FIG. 20A depicts the threshold current density for laser structures with three different thicknesses of the top layer. Upon decrease of $d_{top}$ from $1.5d_1$ to $1.4d_1$, $J_{th}$ increases due to lowering of the optical confinement factor as in FIG. 19A. Further, $J_{th}$ for TE modes is lower than for TM modes, due to a larger optical confinement factor.

Consequently, TE modes are less extended to the air, and no enhancement of either electric or magnetic field occurs in the air, and the fraction of power accumulated in the air (FIG. 20B) is lower than that for TM modes (FIG. 13B). This fraction varies from 5.7% for the top layer thickness $d_{top}=1.5d_1$ to 10.2% for the top layer thickness $d_{top}=1.4d_1$. An even stronger difference from the TM modes occurs for the spectral width of $J_{th}$ and $g_{th}$ (FIGS. 20C and 20D). As the gain curve $J_{th}(\lambda)$ for the thickness $d_{top}=1.5d_1$ is shallow, it is not possible to define the width of the spectral range, in which the threshold current density exceeds its minimum value by a factor less than 2.

A one skilled in the art will appreciate that the similar structures localizing surface-trapped TM- or TE-polarized optical mode can be used as semiconductor optical amplifiers. The transparence material gain obeys equation similar to (6), $$\delta_{TM/TE}g_{transparency}=\alpha_{leakage}+\alpha_{abs}^{modal}, \tag{14}$$

and the transparency current density can be found from $$\Gamma_{TM/TE}g_0\ln\left(\frac{J_{transparency}}{J_0}\right) = \alpha_{leakage} + \alpha_{abs}^{modal}, \tag{15}$$

Then the same effect of the interplay of an optical confinement factor decreasing upon increasing wavelength and a leakage loss increasing upon decreasing wavelength results in a stabilization of the wavelength, the transparency current at which is minimum. This wavelength also shifts upon temperature increase at the same low rate ~0.07 nm/K.

Once a semiconductor optical amplifier operates at a fixed current density $J_{operation}$, the dimensionless gain of the amplifier $$G = \exp\left\{\left[\Gamma_{TM/TE}g_0\ln\left(\frac{J_{operation}}{J_0}\right) - \alpha_{leakage} - \alpha_{abs}^{modal}\right]L\right\}, \tag{16}$$

where L is the chip length, also has a maximum at a certain wavelength. is wavelength also shifts upon temperature increase at the same low rate ~0.07 nm/K. Thus, a further embodiment of the present invention is a wavelength-stabilized semiconductor optical amplifier.

A lower fraction of the optical power accumulated in the air for the TE-polarized mode (FIG. 20B) with respect to that for the TM-polarized mode (FIG. 13B) renders the devices based on the TM-mode more suitable for the applications where a significant field extension into the near-field zone in the air or in a dielectric is needed.

Figure 22:
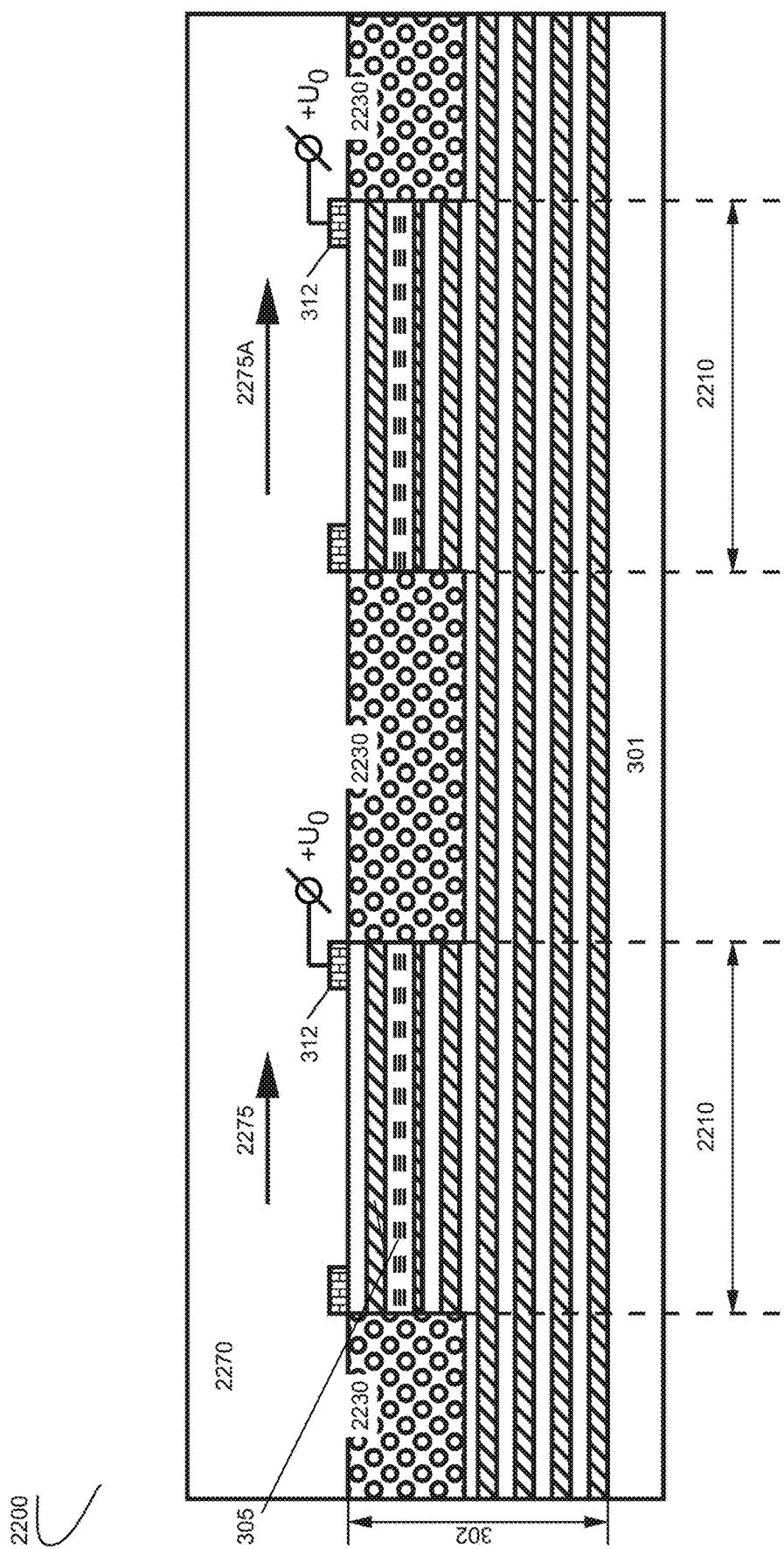
FIG. 22. A part of an optical integrated circuit, according to another embodiment of the present invention, whereas the near field semiconductor optical amplifiers provide amplification of the optical wave propagating along the waveguide.

FIG. 22 illustrates a part of an optical integrated circuit (2200), according to another embodiment of the present invention. Two semiconductor optical amplifiers (2210) are formed on a single epitaxial wafer having the common part of the DBR (302). The space between amplifiers is filled by a dielectric (2230) for planarization of the device. Preferably BCB is used for planarization as is also typically used for VCSELs. A planar dielectric waveguide (2270) is attached to the planarized structure of the semiconductor optical amplifiers. The optical mode propagating along the waveguide (2270) is coupled to the surface-trapped modes of the semiconductor optical amplifiers.

Therefore the optical wave propagating along the planar waveguide is being amplified, as is illustrated by an arrow (2275A) which is shown longer than the arrow (2275), demonstrating the amplification of light. It should be emphasized that the semiconductor optical amplifiers (2210) are wavelength-stabilized, which is particularly advantageous for the amplification of light created by a wavelength-stabilized source.

Figure 23:
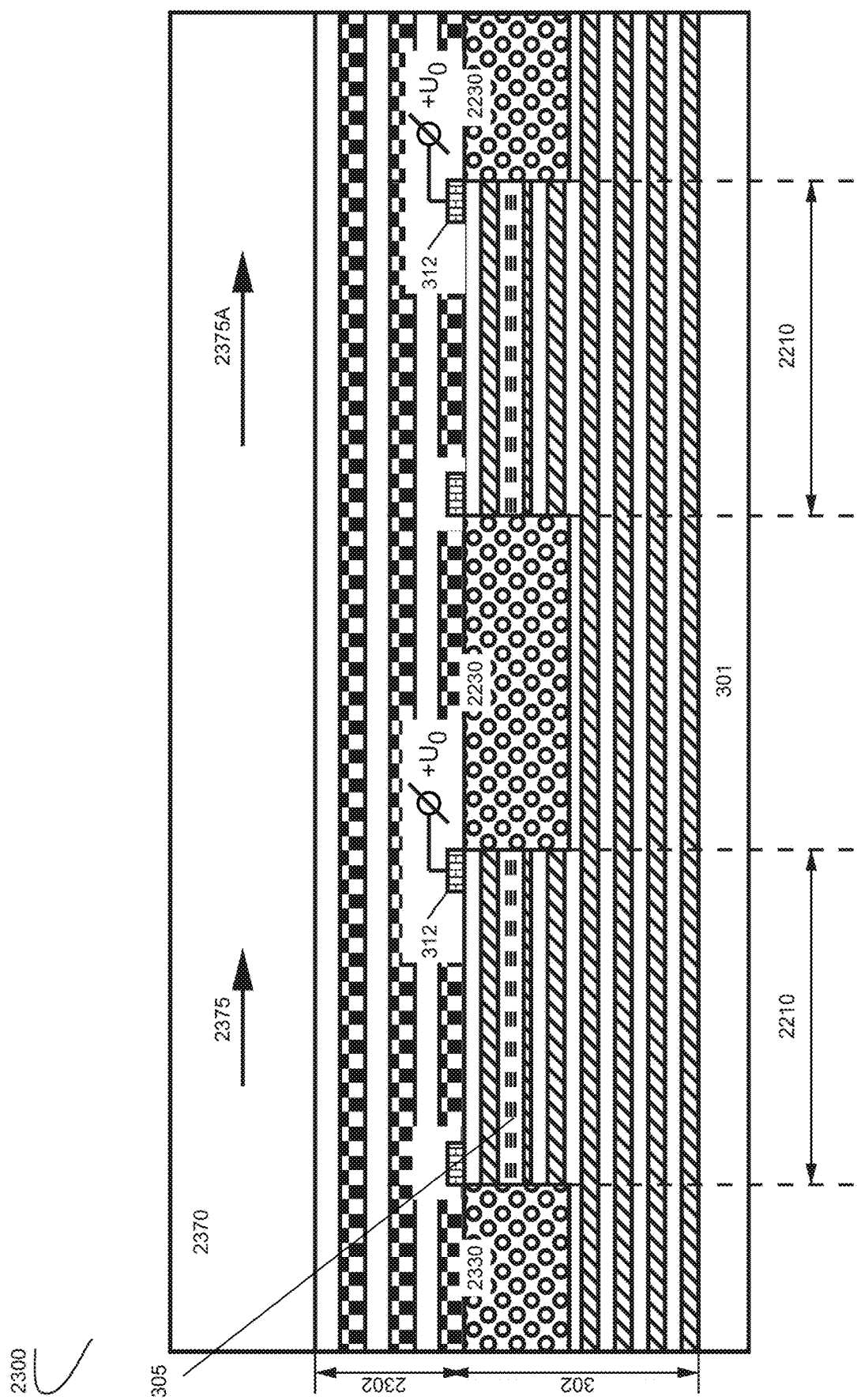
FIG. 23. A part of an optical integrated circuit, according to yet another embodiment of the present invention, whereas the near field semiconductor optical amplifiers provide amplification of the optical wave propagating along the waveguide.

FIG. 23 illustrates a part of an optical integrated circuit (2300), according to yet another embodiment of the present invention. The structure includes an additional dielectric DBR (2302). The surface-trapped optical mode is localized at a boundary between a dielectric waveguide (2370) and the DBR (2302). The active region (305) is located at a larger depth from the surface, but the surface-trapped optical mode is still being amplified, as is illustrated by an arrow (2375A) which is shown longer than the arrow (2375), demonstrating the amplification of light.

Figure 24:
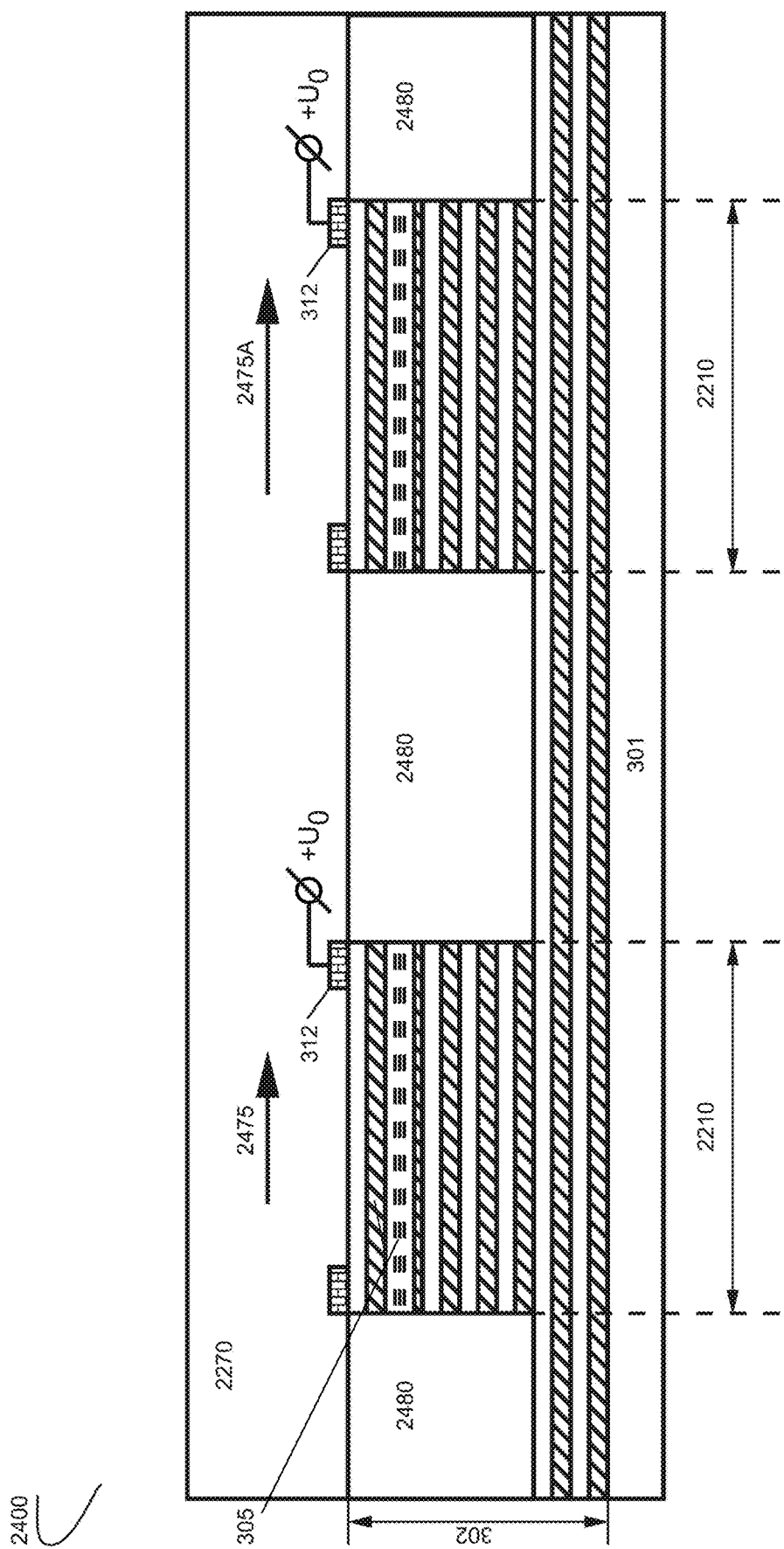
FIG. 24. A part of an optical integrated circuit, according to a further embodiment of the present invention, whereas the near field semiconductor optical amplifiers provide amplification of the optical wave propagating along the waveguide.

FIG. 24 illustrates a part of an optical integrated circuit (2400), according to yet another embodiment of the present invention. The structure is similar to that of FIG. 22, but the space between the amplifiers is filled by the dielectric (2480) such, that a difference in refractive indices between the dielectric in the dielectric waveguide (2270) and the dielectric in the spacers is, by its absolute value, small, preferably smaller than 0.02. More preferably, the difference is smaller than 0.01. Practically, this can be the same material, having the same refractive index. Or there can still be a minor difference in refractive indices, due to different technological conditions in deposition of the same material in (2480) and in (2470). In this embodiment, the front facet of each semiconductor optical amplifier will be extremely antireflective, which is advantageous for the amplifiers. Therefore the optical wave propagating along the planar waveguide is being amplified, as is illustrated by an arrow (2475A) which is shown longer than the arrow (2475), demonstrating the amplification of light.

A one skilled in the art will appreciate, that, instead of a DBR, a different type of a multilayer interference reflector (MIR) can be used, in which the surface-trapped mode will exhibit and oscillatory decay away from the surface.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. An in-plane emitting optoelectronic device comprising
a) a multilayer interference reflector bounded from the top by a homogeneous medium having a refractive index lower than the refractive index of the topmost layer of said first multilayer reflector;
b) an active medium located within said multilayer interference reflector;
c) a substrate contiguous to said multilayer interference reflector at a side opposite to said homogeneous medium;
wherein said multilayer interference reflector localizes a surface-trapped optical mode;
wherein said surface-trapped optical mode
i) is localized at a boundary between said multilayer interference reflector and said homogeneous medium; and
ii) exhibits an evanescent decay in said homogeneous medium away from said boundary; and
iii) exhibits an oscillatory decay in said multilayer interference reflector away from said boundary; and
iv) the optical confinement factor of said surface-trapped optical mode decreases upon increase in wavelength of light; and
v) the leakage loss of said surface-trapped optical mode into said substrate increases upon decrease in wavelength of light; and
wherein said optoelectronic device operates in a wavelength-stabilized optical mode.

2. The optoelectronic device of claim 1, wherein said optoelectronic device contains no resonant cavity.

3. The optoelectronic device of claim 1, wherein said homogeneous medium is selected from the group consisting of:
a) a dielectric material; and
b) air.

4. The optoelectronic device of claim 1, wherein said surface-trapped optical mode is selected from the group consisting of:
i) a TM-polarized optical mode; and
ii) a TE-polarized optical mode.

5. The optoelectronic device of claim 1, wherein a fraction of the optical power of said surface-trapped optical mode accumulated in said homogeneous medium is above ten percent.

6. The optoelectronic device of claim 5, wherein a fraction of the optical power of said surface-trapped optical mode accumulated in said homogeneous medium is above thirty percent.

7. The optoelectronic device of claim 6, wherein a fraction of the optical power of said surface-trapped optical mode accumulated in said homogeneous medium is above fifty percent.

8. The optoelectronic device of claim 1, wherein the wavelength of said wavelength-stabilized surface-trapped optical mode shifts upon temperature increase at a rate below zero point one nanometer per Kelvin.

9. The optoelectronic device of claim 1,
d) further comprising a front facet;
wherein said front facet is an uncoated front facet, and
wherein said front facet has a reflectivity of said uncoated front facet below four percent.

10. The optoelectronic device of claim 9, wherein the facet reflectivity of said uncoated front facet is below one times ten to the power minus three.

11. The optoelectronic device of claim 10, wherein the facet reflectivity of said uncoated front facet is below one times ten to the power minus four.

12. The optoelectronic device of claim 11, wherein the facet reflectivity of said uncoated front facet is below one times ten to the power minus five.

13. The optoelectronic device of claim 10,
e) further comprising an intermediate reflective coating deposited on said front facet.

14. The optoelectronic device of claim 1, wherein said active medium is placed in said multilayer interference reflector at a distance from said boundary not exceeding one micrometer.

15. The optoelectronic device of claim 14, wherein said active medium is placed in said multilayer interference reflector at a distance from said boundary not exceeding zero point five micrometer.

16. The optoelectronic device of claim 1, further comprising
a means of generating non-equilibrium carriers in said active medium.

17. The optoelectronic device of claim 16,
wherein said means of generating of non-equilibrium carriers is selected from the group consisting of:
(i) current injection;
(ii) photoexcitation; and
(iii) electron beam excitation.

18. The optoelectronic device of claim 1, further comprising a p-n junction;
wherein said active medium is located within said p-n junction.

19. The optoelectronic device of claim 1,
wherein said active medium is selected from a group consisting of:
i) a bulk material;
ii) single or multiple quantum well;
iii) single or multiple sheet of quantum wires;
iv) single of multiple sheet of quantum dots; and
v) any combination of i) through iv).

20. The optoelectronic device of claim 1,
wherein said multilayer interference reflector and said active medium are formed of semiconductor materials selected from the group consisting of:
(i) III-V materials;
(ii) III-N materials;
(iii) II-VI materials;
(iv) group IV materials; and
(v) any combination of (i) through (iv).

21. The optoelectronic device of claim 1,
wherein said optoelectronic device is selected from the group consisting of:
(i) edge-emitting laser;
(ii) semiconductor optical amplifier; and
(iii) semiconductor gain chip.

22. An optical integrated circuit, comprising
(i) at least one optoelectronic device according to claim 1; and
(ii) a planar optical waveguide.

23. The optical integrated circuit of claim 22,
wherein said at least one optoelectronic device according to claim 1 is a semiconductor optical amplifier.

24. The optical integrated circuit of claim 23,
wherein said planar optical waveguide (2270) is formed of a first dielectric material;
wherein a second dielectric material (2480) is attached in the lateral plane to at least one facet of said semiconductor optical amplifier;
wherein the absolute value of a difference in refractive indices between the dielectric in the dielectric waveguide (2270) and the dielectric (2480) in the spacers is below zero point zero two;
wherein the facet reflectivity of said at least one facet of said semiconductor optical amplifier is below one times ten to the power minus three.

\* \* \* \* \*